United States Patent
Ogino et al.

(10) Patent No.: US 7,847,362 B2
(45) Date of Patent: Dec. 7, 2010

(54) PHOTO DETECTOR, IMAGE SENSOR, PHOTO-DETECTION METHOD, AND IMAGING METHOD

(75) Inventors: Masaya Ogino, Kawasaki (JP); Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 198 days.

(21) Appl. No.: 12/166,467

(22) Filed: Jul. 2, 2008

(65) Prior Publication Data

US 2009/0008735 A1 Jan. 8, 2009

(30) Foreign Application Priority Data

Jul. 6, 2007 (JP) .............................. 2007-178494

(51) Int. Cl.
*H01L 31/06* (2006.01)
(52) U.S. Cl. ............... 257/436; 257/443; 257/E31.054; 257/E31.001
(58) Field of Classification Search ................. 257/436, 257/E31.001, 443, E31.054
See application file for complete search history.

(56) References Cited

U.S. PATENT DOCUMENTS

| | | | |
|---|---|---|---|
| 5,965,875 A | 10/1999 | Merrill | ........................ 250/226 |
| 7,109,517 B2* | 9/2006 | Zaidi | ............................ 257/22 |
| 7,129,466 B2* | 10/2006 | Iwasaki | .................... 250/214.1 |
| 7,538,357 B2* | 5/2009 | Onishi et al. | ................... 257/93 |
| 2003/0127667 A1 | 7/2003 | Inoue et al. | .................. 257/229 |
| 2004/0248331 A1* | 12/2004 | Cox et al. | ...................... 438/22 |
| 2005/0205958 A1* | 9/2005 | Taniguchi et al. | ........... 257/436 |

FOREIGN PATENT DOCUMENTS

| | | |
|---|---|---|
| JP | 2003-142674 A | 5/2003 |
| JP | 2005-268609 A | 9/2005 |
| JP | 2007-13065 A | 1/2007 |
| WO | WO2005/092037 * | 6/2005 |

* cited by examiner

*Primary Examiner*—Ngan Ngo
*Assistant Examiner*—Benjamin Tzu-Hung Liu
(74) *Attorney, Agent, or Firm*—Fitzpatrick, Cella, Harper & Scinto

(57) ABSTRACT

A photo detector includes a photoelectric conversion layer having a periodic structure made of a semiconductor material on a surface of the photoelectric conversion layer. In the photo detector, at least a part of a resonance region formed by the periodic structure is included in the photoelectric conversion layer of the photo detector.

5 Claims, 26 Drawing Sheets

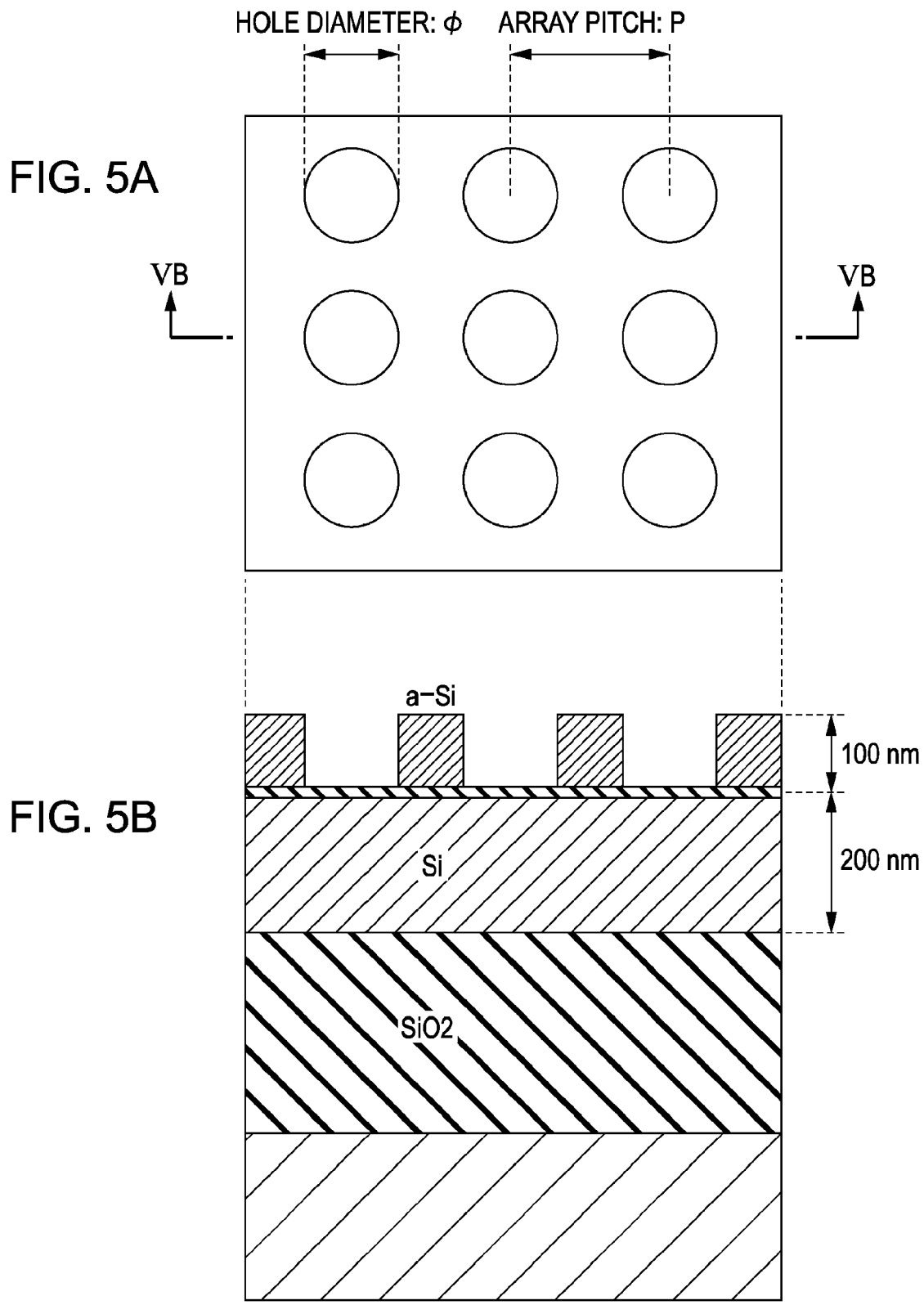

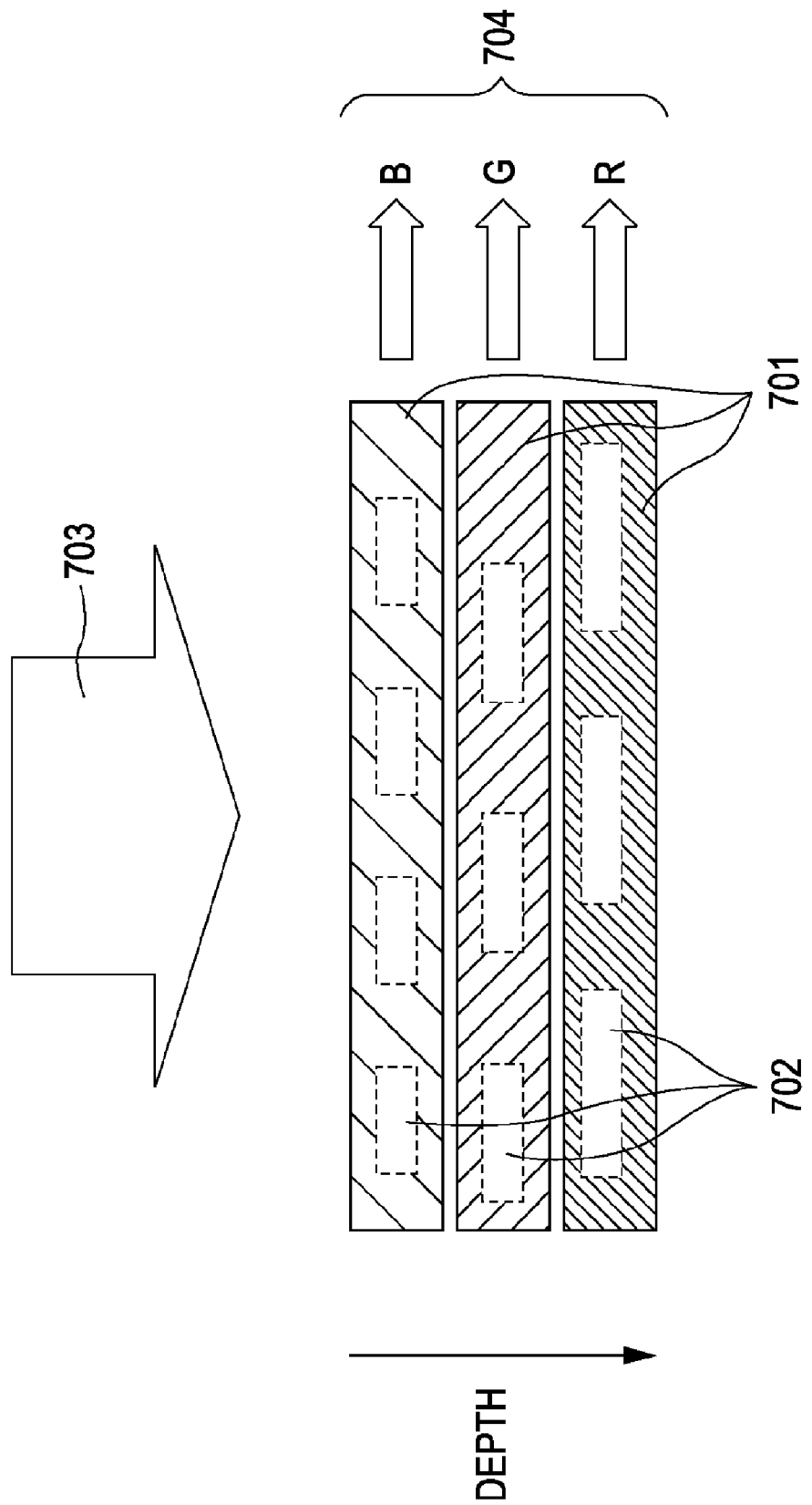

802

↑ INCREASE IN ASPECT RATIO DUE TO INCREASE IN THE NUMBER OF PIXELS

801

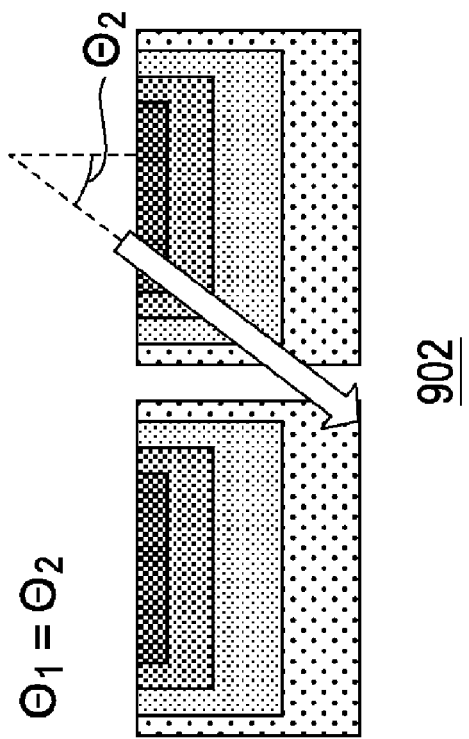
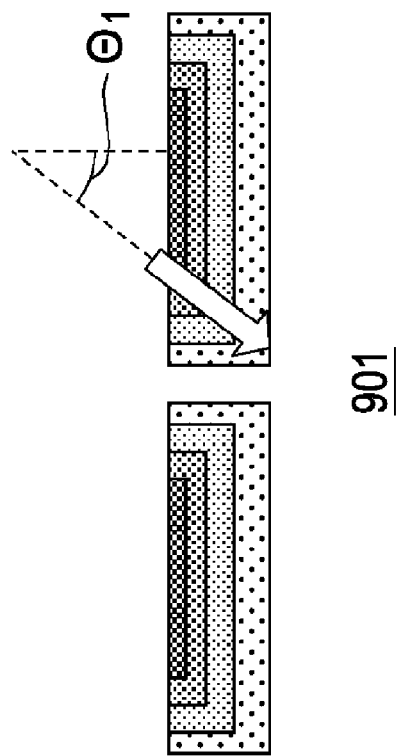
FIG. 9A
FIG. 9B

PHOTO DETECTOR, IMAGE SENSOR, PHOTO-DETECTION METHOD, AND IMAGING METHOD

BACKGROUND OF THE INVENTION

1. Field of the Invention

The present invention relates to a photo detector, an image sensor, a photo-detection method, and an imaging method.

2. Description of the Related Art

Single-crystal silicon (Si) is mainly used as the photoelectric conversion material of photo detectors in the visible range. Silicon (Si) has an internal photoelectric effect with light having a wavelength of 1,100 nm or less, and produces electron and hole pairs inside the crystal. Such an electron and hole pair can be separated by a potential barrier due to a junction or a bias voltage, and extracted, thereby allowing incident light to be detected as an electric signal. Silicon (Si) has a photo sensitivity over a wide range, from X rays to ultraviolet rays to near-infrared rays. However, for some uses of photo detectors, it is desired that sensitivity is only provided for a certain wavelength. To achieve this, a color filter is provided in front of a photodiode used as a photoelectric conversion device.

In a two-dimensional image sensor, color separation is generally performed using color filters of primary colors or complementary colors arranged in the form of a mosaic. However, from the standpoint of a need for increasing the number of pixels (i.e., increasing the number of pixels or decreasing the size of pixels) to achieve a high resolution for the sensor, the size of the sensor structure has not been changed in the height or depth direction, but the size in the in-plane direction has been reduced. Consequently, the structure of each pixel of the sensor has a high aspect ratio (i.e., the ratio of the height or depth of the sensor to the diameter of a light-receiving surface is large). Accordingly, eclipsing and color mixing easily occur. Furthermore, the size of such color filters has also been reduced with decreasing pixel size. Accordingly, forming different color filters for small areas makes it difficult to decrease the cost.

Consequently, in order to prevent color mixing, Japanese Patent Laid-Open No. 2003-142674 discloses a MOS-type solid-state image sensor in which photoelectric conversion regions and signal scanning circuit regions are separated by trench isolation regions, wherein the sensor includes element isolation diffusion layers provided at a position deeper than a photodiode diffusion layer below the bottom surface of the trench isolation regions. This arrangement blocks leakage current between pixels and suppresses color mixing. Japanese Patent Laid-Open No. 2007-13065 discloses a near-infrared photo detector in which photonic crystals, which are designed so as to have a periodic-refractive-index structure having a resonance peak in a near-infrared wavelength range, are provided on a photoelectric conversion region. This photo detector realizes a high-speed photo detection operation and an improvement in the quantum efficiency.

In order to obtain a color image, color information is necessary for each of the very small blocks (pixels) used for forming the image. All colors are formed by a mixture of three colors of red (R), green (G), and blue (B), and differences in the colors are caused by differences in the mixing ratio of the three colors. That is, in order to obtain a color image, the light intensity ratio of the three colors of RGB is detected for each block. In a still camera, color filters that transmit only one of the three colors of RGB are disposed in the form of a mosaic in front of a detector, and an interpolation operation is performed on adjacent pixels on the basis of the intensity ratio. Accordingly, the intensity ratio of the three colors of RGB for each pixel is determined, and thus, a color image is obtained. This method is widely used. Regarding the arrangement of color filters, color filters having the Bayer arrangement, in which a certain row has an arrangement of RGRG and the next row has an arrangement of GBGB, or color filters having a stripe of G and a checkered arrangement of RB are often used.

However, image sensors utilizing an arrangement of color filters has some problems. One of the problems is the loss of light caused by using color filters. For example, light that can pass through a red color filter is composed of a spectrum component corresponding to red light. Other spectrum components corresponding to blue and green light are absorbed by the filter, and, thus, these spectrum components are not utilized in the formation of an image. When the resolution of an image sensor is further increased in the future to decrease the size of pixels, the S/N ratio will be a matter for concern and the loss of light will not be negligible. Another problem is the decrease in the resolution caused by a low-pass filter. When an image composed of different colors contained in very small areas, e.g., substantially spaced at intervals of pixels, is input to an image sensor utilizing a color filter arrangement, false colors, which are different from the original colors of the image, are generated. In order to suppress generation of these false colors, it is necessary to gradate the image using an optical low-pass filter.

The image sensor disclosed in U.S. Pat. No. 5,965,875 is an example of an image sensor that compensates for the problems associated with the use of color filters. The specification of this patent document proposes a photo-detection method that uses a two-dimensionally laminated image sensor in which a pixel has a multilayer structure and the three colors of RGB are detected at different depths utilizing differences in the absorption coefficients of Si. In this two-dimensionally laminated image sensor, a high S/N ratio can be expected because photo detectors having a spectroscopic function are arranged and loss of light due to the presence of a color filter does not occur. Japanese Patent Laid-Open No. 2005-268609 discloses a method of laminating organic photoelectric conversion layers having different absorption wavelength ranges. This method senses an image composed of three colors of RGB using such a laminated structure, and an optical low-pass filter is necessary to suppress an aliasing distortion at the Nyquist frequency or lower frequencies. However, in this method using the laminated structure, the cutoff frequency can be higher than that in the method using color filters, and absence of high-frequency components can be suppressed.

In the image sensor described in Japanese Patent Laid-Open No. 2003-142674, since a photoelectric conversion layer (photodiode) is formed so as to extend to a shallow position, the sensitivity is sacrificed. As a result, the image sensor may not be sensitive particularly to red (R) light for which the absorption coefficient of Si is low. In the photo detector disclosed in Japanese Patent Laid-Open No. 2007-13065, since the periodic structure is composed of $SiO_2$ having a low loss, a resonance peak becomes steep, and this structure is not necessarily suitable for color separation of visible light.

In the device disclosed in U.S. Pat. No. 5,965,875, a two-dimensionally laminated image sensor includes arranged photo detectors having a spectroscopic function, and performs spectral separation utilizing differences in the absorption coefficients of Si for different components of light. Therefore, this device is disadvantageous in that the film thickness of the device is large, and color mixing easily occurs when light is incident at an angle (see a description below of the case where a thick photo detector 902 is used, as shown in FIG. 9B). Furthermore, this device is disadvantageous in that it is difficult to achieve satisfactory color separability together with a high sensitivity.

In the laminate image sensor disclosed in Japanese Patent Laid-Open No. 2005-268609, color separability can be improved by spectral separation performed by adjusting the spectral sensitivity of an organic dye. However, this sensor has a problem of chemical instability, because an organic substance is used. In addition, this sensor is disadvantageous in that the sensitivity is not satisfactory because of its low carrier mobility. Furthermore, this sensor also has a problem in terms of the incompatibility of a production process of the sensor with a production process of peripheral circuits, such as a readout circuit and an amplifying circuit.

SUMMARY OF THE INVENTION

The present invention provides a photo detector, an image sensor, a photo-detection method, and an imaging method in which the thickness of the device can be reduced, color mixing can be suppressed, satisfactory color separability can be achieved together with high sensitivity, chemical stability can be achieved, and the compatibility of a production process of the device with a production process of peripheral circuits can be realized.

A photo detector according to a first aspect of the present invention includes a photoelectric conversion layer having a periodic structure made of a semiconductor material on a surface thereof, wherein at least a part of a resonance region formed by the periodic structure is included in the photoelectric conversion layer.

A photo detector according to a second aspect of the present invention includes a plurality of laminated photoelectric conversion layers, wherein optical resonant structures having resonance peaks in different wavelength ranges are provided in the photoelectric conversion layers so as to correspond to the photoelectric conversion layers.

The present invention includes an image sensor, a photo-detection method, and an imaging method.

An image sensor according to an aspect of the present invention includes a plurality of the photo detectors according to the first aspect of the present invention, wherein the photo detectors are arranged in a two-dimensional surface.

An image sensor according to another aspect of the present invention includes a plurality of the photo detectors according to the second aspect of the present invention, wherein the photo detectors are two-dimensionally arranged.

A photo-detection method according to an aspect of the present invention includes the steps of preparing a photo detector to include a photoelectric conversion layer having a periodic structure made of a semiconductor material on a surface thereof, wherein at least a part of a resonance region formed by the periodic structure is included in the photoelectric conversion layer; and allowing light to be incident on the periodic structure, thereby causing resonance of a light component having a specific wavelength by the periodic structure, and performing photoelectric conversion of the resonant light component with the photoelectric conversion layer.

A photo-detection method according to another aspect of the present invention includes the steps of preparing a photo detector having a structure in which a plurality of photoelectric conversion layers are laminated, wherein optical resonant structures having resonance peaks in different wavelength ranges are provided in the photoelectric conversion layers so as to correspond to the photoelectric conversion layers; and allowing light to be incident on the photo detector, thereby spectrally separating the incident light by the optical resonant structures, and performing photoelectric conversion with the photoelectric conversion layers.

An imaging method according to an aspect of the present invention includes the steps of preparing an image sensor composed of a plurality of photo detectors each including a photoelectric conversion layer having a periodic structure made of a semiconductor material on a surface thereof, wherein at least a part of a resonance region formed by the periodic structure is included in the photoelectric conversion layer, the photo detectors being arranged in a two-dimensional surface; allowing light to be incident on the periodic structure constituting each of the photo detectors, thereby causing resonance of a light component having a specific wavelength by the periodic structure, and performing photoelectric conversion of the resonant light component with the photoelectric conversion layer; and obtaining a two-dimensional image on the basis of electric signals obtained from the photo detectors.

An imaging method according to another aspect of the present invention includes the steps of preparing an image sensor to include a plurality of photo detectors each including a plurality of laminated photoelectric conversion layers, wherein optical resonant structures having resonance peaks in different wavelength ranges are provided in the photoelectric conversion layers so as to correspond to the photoelectric conversion layers, the photo detectors being two-dimensionally arranged; allowing light to be incident on the photo detectors, thereby spectrally separating the incident light by the optical resonant structures, and performing photoelectric conversion with the photoelectric conversion layers; and obtaining a two-dimensional image on the basis of electric signals obtained from the photo detectors.

Various aspects of the present invention can provide a photo detector that can adjust the spectral sensitivity without using a color filter. For example, a device according to an aspect of the present invention can have a reduced thickness. Accordingly, color mixing can be suppressed, and satisfactory color separability can be achieved together with high sensitivity. Furthermore, various aspects of the present invention can provide a photo detector and an image sensor that have excellent chemical stability and in which compatibility of a production process of the device with a production process of peripheral circuits can be achieved. Furthermore, a photo-detection method and an imaging method using such a device can be realized.

Further features of the present invention will become apparent from the following description of exemplary embodiments with reference to the attached drawings.

BRIEF DESCRIPTION OF THE DRAWINGS

FIGS. 5A and 5B are views showing a structure of the photo detector of the second embodiment and illustrating numeric parameters thereof.

FIG. 7 is a cross-sectional view illustrating an example of a structure of a photo detector according to a second aspect of the present invention.

FIGS. 9A and 9B are views illustrating a relationship between the thickness of the photo detector according to the second aspect of the present invention and the ease of the occurrence of color mixing.

DESCRIPTION OF THE EMBODIMENTS

First Aspect of the Present Invention

Figure 1:
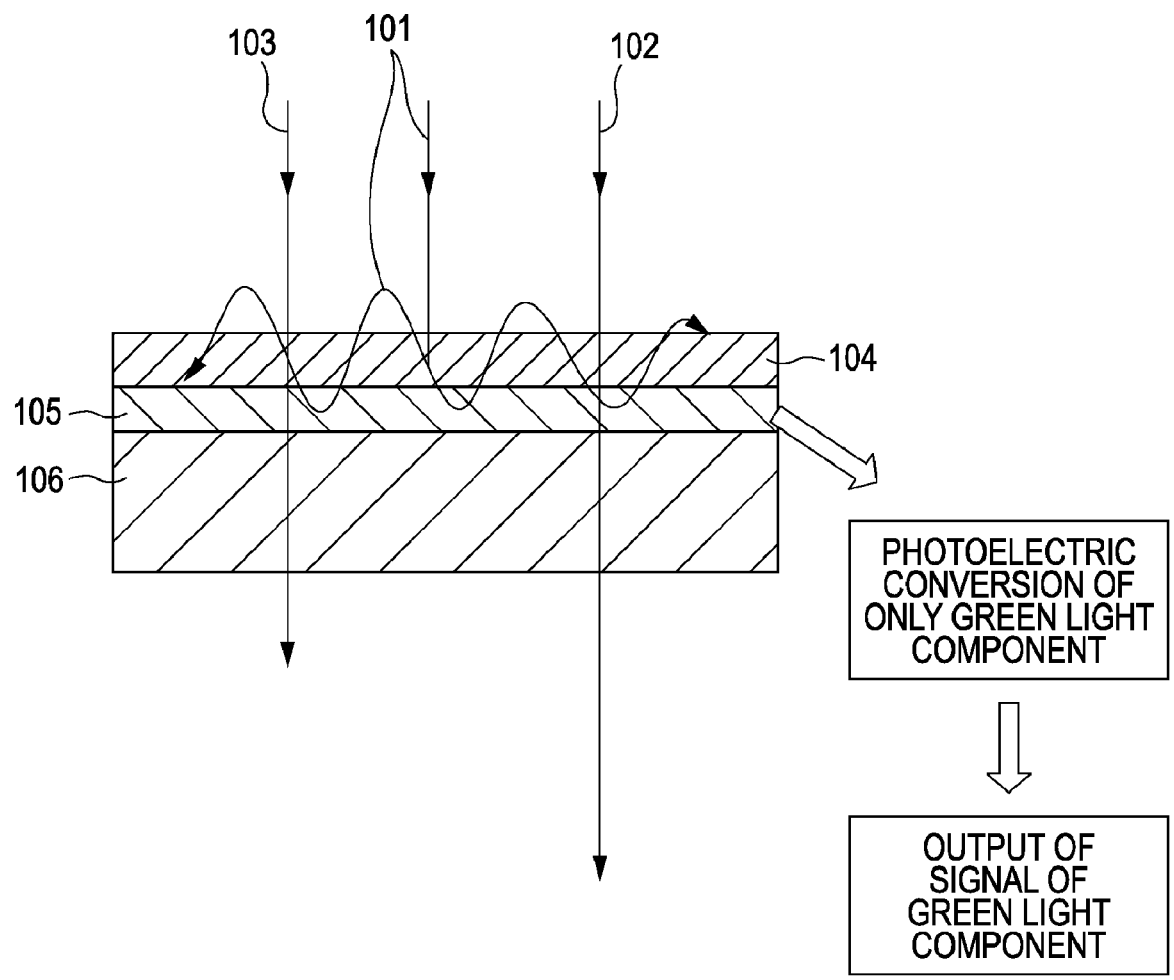
FIG. 1 is a cross-sectional view illustrating a function of a photo detector according to a first aspect of the present invention.

A photo detector according to a first aspect of the present invention includes a photoelectric conversion layer having a periodic structure made of a semiconductor material on a surface thereof, wherein at least a part of a resonance region formed by the periodic structure is included in the photoelectric conversion layer.

In the photo detector according to the first aspect of the present invention, by disposing a periodic structure near a photoelectric conversion material, an incident light component in a specific wavelength range is spatially localized by resonance with the structure, and the localized light component selectively undergoes photoelectric conversion. Thereby, an image sensor that has a small thickness and high photoelectric conversion efficiency, and that can be produced at a reduced cost, can be realized. The reason for this will be described below.

An interesting characteristic of a periodic structure having a size substantially equal to the wavelength of light is referred to as "guided-mode resonance." Guided-mode resonance is a phenomenon in which light incident from an out-of-plane direction of a two-dimensional periodic structure is coupled with guided light in the plane to cause resonance. There are various types of two-dimensional periodic structures that cause guided-mode resonance. From the standpoint of a periodic structure of lattice points, the two-dimensional periodic structure may be a tetragonal lattice, a triangular lattice, or a complex lattice including two or more types of lattices. For example, structure of each of the lattice points may be a hole or a pillar, and the shape thereof may be a circle or a polygon. The periodic structure has a resonance condition corresponding to the structure. Materials forming a periodic structure can generate guided-mode resonance as long as the materials diffract light to convert it to guided light in the plane.

In a collective of atoms or molecules forming a substance, discrete levels are coupled to each other by spatial overlapping of their electron orbits to form a band structure. The band structure is different depending on the properties of the atoms or molecules constituting the substance and the collective state thereof. However, a substance may be categorized as a semiconductor or a dielectric (insulator) depending on the gap (band gap) between the valence band and the conduction band of the substance. In the case where light is incident on a material having a band gap, when energy of the incident light is smaller than the band gap energy, the incident light is not absorbed by an interband transition. In this case, when the light is not scattered or diffracted, the light is transmitted. When energy of the incident light is close to the band gap energy, the incident light allows electrons to be excited to the conduction band, and the light itself is absorbed. Optically, this phenomenon corresponds to a loss. In the case where a semiconductor in which the band gap energy is close to the energy of incident light is used as a periodic structure, the Q-value of resonance is decreased by the loss, and the resonance peak extends over a wide range. For general uses, a high Q-value of resonance is often useful. However, in order to perform color separation of visible light, it is necessary to broaden the band range of the resonance peak, and, thus, a semiconductor is used rather than a dielectric having a low loss. With respect to mixing of impurities during a process, Si can be used as the semiconductor material. From the standpoint of the ease of a process, amorphous Si can be used.

When guided-mode resonance is generated, a light component having a resonant wavelength is localized in the plane of a periodic structure and the vicinity thereof. This localized position can be controlled by controlling three-dimensional parameters of the periodic structure. A photoelectric conversion material corresponding to an expansion of a localized electric field formed by the periodic structure is disposed near the localized electric field. The photoelectric conversion material is a material that can convert a photon into an electron or a hole. Specifically, the photoelectric conversion material may be a semiconductor forming a PN junction, a PIN junction, or a Schottky junction. A PN junction is advantageous in that it can be relatively easily produced. A PIN junction is advantageous in that the sensitivity can be further improved by increasing the area of a depletion layer. When a Schottky junction formed between a metal and a semiconductor is used, the operation can be performed at a higher speed. By disposing a photoelectric conversion material near a localized electric field, even when white light is incident, photoelectric conversion of only a light component having a resonant wavelength can be selectively performed. That is, when light components having wavelengths other than the resonant wavelength enter the photoelectric conversion material together with a light component having the resonant wavelength, most of the light components are transmitted without undergoing photoelectric conversion if a thin photoelectric conversion material having an absorption coefficient that is not excessively large is used. On the other hand, the light component having the resonant wavelength remains localized near the photoelectric conversion material for a long time. Accordingly, the probability of absorption increases, thus realizing an effect comparable to an increase in the absorption coefficient of the photoelectric conversion material. That is, by utilizing resonance or spatial localization of light due to the presence of a structure, the spectral sensitivity and the absorption coefficient of the photoelectric conversion material can be changed without changing the type of the photoelectric conversion material.

FIG. 1 is a schematic view of a photo detector in which the spectral sensitivity and the absorption coefficient are changed by appropriately choosing a photoelectric conversion material or appropriately forming the structure near the material. The photo detector shown in FIG. 1 includes a substrate 106, a photoelectric conversion layer 105 provided on the substrate 106, and a structure 104 that resonates with a green (G) light component, and can be used in aspects of the present invention. FIG. 1 shows the case where light components corresponding to R (red), G (green), and B (blue) enter the photo detector having the structure 104 that resonates with a green light component. A green light component 101 is localized to the structure 104 or guiding layer due to the resonance with the structure 104, and undergoes photoelectric conversion by the photoelectric conversion layer 105 disposed near the structure 104. In contrast, most of a red light component 102 and a blue light component 103 pass through the photoelectric conversion layer 105 and do not undergo photoelectric conversion.

In the photo detector of aspects of the present invention, the structure 104 that resonates with a specific light component of incident light is composed of a periodic structure made of a semiconductor material, and at least a part of the resonance region of light formed by the periodic structure is included in the photoelectric conversion layer 105. The incident light is diffracted by the periodic structure, and a light component having a specific wavelength depending on parameters (e.g., the size of irregularities, the depth, and the pitch) defining the periodic structure generates guided-mode resonance. Since at least a part of the resonance region is included in (extends to) a waveguide layer, this structure can achieve a state in which the light component stays in the waveguide layer for a long time. Consequently, the efficiency of the photoelectric conversion can be improved, and the thickness of the photoelectric conversion layer can be reduced.

A photo detector according to aspects of the present invention may detect visible light. In such a photo detector, the periodic structure may be made of Si. The periodic structure may be made of single-crystal Si. The periodic structure may be made of polycrystalline Si. The periodic structure may be made of amorphous Si. In such a photo detector, the photoelectric conversion layer may be made of single-crystal Si. The photo detector may be composed of a silicon-on-insulator (SOI) substrate. The periodic structure may be a lattice array provided in a two-dimensional surface. The lattice array may be a tetragonal lattice array or a triangular lattice array. The lattice array constituting the periodic structure may have a plurality of periods.

In addition, an aspect of the present invention provides a photo-detection method that includes steps of preparing a photo detector to include a photoelectric conversion layer having a periodic structure made of a semiconductor material on a surface thereof, wherein at least a part of a resonance region formed by the periodic structure is included in the photoelectric conversion layer; and allowing light to be incident on the periodic structure, thereby causing resonance of a light component having a specific wavelength by the periodic structure, and performing photoelectric conversion of the resonant light component with the photoelectric conversion layer.

A two-dimensional image sensor can be realized by disposing a plurality of photo detectors, such as those according to the first aspect of the present invention, in the form of an array. As a result of a control of the spectral sensitivity realized by the photo detector, dye color filters need not be provided even in a single-plate color-image sensor, and, thus, the thickness of the photo detector can be reduced. Accordingly, eclipsing and color mixing of light can be suppressed. As a result of the realization of a control of the absorption coefficient, a satisfactory photoelectric conversion efficiency can be achieved even in a thin photoelectric conversion region. Accordingly, color mixing of carriers (electrons and holes) can be suppressed without degrading the sensitivity.

Dye filters used in a commercially available typical single-plate color-image sensor have a structure according to the Bayer arrangement, which has an alternating arrangement of RGBG, or a complementary-color checkered arrangement, which has an alternating arrangement of CMYG (cyan, magenta, yellow, and green). In such filters, the colors are separately formed using different materials. Therefore, in producing such filters, separate processes are necessary for each of the colors of the filters.

In a color image sensor including photo detectors of the present invention, the spectral sensitivity is controlled by the structure, and thus it is not necessary to use different materials for different colors. Accordingly, a detector that can detect a plurality of colors can be produced at one time using a fine processing technology such as lithography. As a result, the production cost can also be reduced.

An aspect of the present invention provides an imaging method that includes steps of preparing an image sensor to include a plurality of photo detectors each including a photoelectric conversion layer having a periodic structure made of a semiconductor material on a surface thereof, wherein at least a part of a resonance region formed by the periodic structure is included in the photoelectric conversion layer, the photo detectors being arranged in a two-dimensional surface; allowing light to be incident on the periodic structure constituting each of the photo detectors, thereby causing resonance of a light component having a specific wavelength by the periodic structure, and performing photoelectric conversion of the resonant light component with the photoelectric conversion layer; and obtaining a two-dimensional image on the basis of electric signals obtained from the photo detectors.

Second Aspect of the Present Invention

A photo detector according to a second aspect of the present invention includes a plurality of laminated photoelectric conversion layers, wherein optical resonant structures having resonance peaks in different wavelength ranges are provided in the photoelectric conversion layers so as to correspond to the photoelectric conversion layers. Furthermore, an image sensor according to an aspect of the present invention includes a plurality of the photo detectors configured in accordance with the second aspect of the present invention, wherein the photo detectors are two-dimensionally arranged.

In a two-dimensional image sensor in which the number of pixels has been rapidly increasing for the purpose of the realization of high image quality, the above structure according to the second aspect of the present invention can provide a photo detector and an image sensor in which a problem of color mixing caused by an increase in the angle of incidence of incident light due to a reduction in the pixel size of a photo detector can be prevented.

FIG. 7 shows an example of the structure of a photo detector according to the second aspect of the present invention. In the photo detector according to the second aspect of the present invention, optical resonant structures are provided in light-receiving elements (photoelectric conversion layers), and color separation is performed by utilizing a property of localized plasmon resonance or guided-mode resonance. For example, the photo detector shown in FIG. 7 has a structure in which plasmon resonators 702 having different resonant frequencies are provided in photoelectric conversion elements (photoelectric conversion layers) 701. Accordingly, the thickness of the photo detector can be reduced without decreasing the sensitivity thereof. Consequently, this structure can suppress color mixing for light incident at an angle.

Figure 8B:
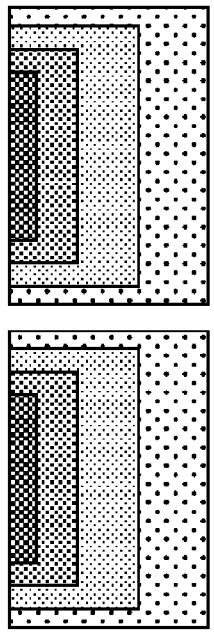
FIGS. 8A and 8B are cross-sectional views, which illustrate that a size of each pixel of a photo detector may be reduced by increasing a number of pixels of an image sensor according to the second aspect of the present invention.
Figure 8A:
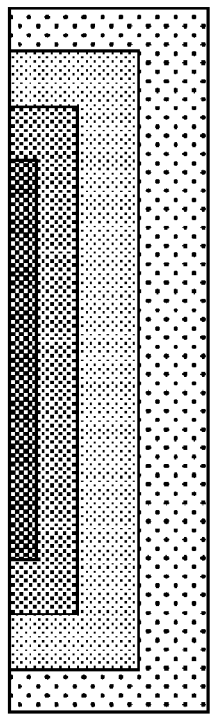

Next, a description will be made of a specific reason why color mixing occurs as the angle of incidence of incident light is increased by a reduction in the pixel size. FIGS. 8A and 8B are cross-sectional views illustrating a situation in which a size of each pixel of a photo detector is reduced by increasing the number of pixels of an image sensor. FIG. 8A is a cross-sectional view of a single pixel 801 in the case of a small number of pixels, and FIG. 8B is a cross-sectional view of a single pixel 802 in the case of a large number of pixels. When the number of pixels is increased while the size of the whole image sensor is maintained, the size of each pixel of the photo detector is decreased.

The size of the pixel 801 in the case of a small number of pixels shown in FIG. 8A is inevitably decreased in the in-plane direction in the case of a large number of pixels shown in FIG. 8B. As a result, the size of each pixel is decreased as shown in the pixel 802 of FIG. 8B. Although the dimension of the photo detector constituting a pixel in the in-plane direction can be decreased, the dimension of the photo detector in the depth direction cannot be decreased because the above-mentioned absorption coefficients are determined in accordance with the type of material used. Consequently, the aspect ratio of the photo detector is further increased, and thus color mixing easily occurs. As the pixel size decreases, the intensity of detected light also decreases, and thus, the aperture ratio must be increased. As a result, the angle of incidence of incident light for the pixel is increased. The distance between an exit pupil and an image sensor has been decreased because of a requirement for a reduction in the thickness of a lens. As a result, the angle of incidence to an adjacent pixel has been increased. Consequently, mixing of photons or electrons in the adjacent pixel or a readout circuit increases, and color mixing and eclipsing easily occur.

FIGS. 9A and 9B are views illustrating the relationship between the thickness of the photo detector according to the second aspect of the present invention and the ease of the occurrence of color mixing. FIG. 9A is a cross-sectional view illustrating a case where light is incident on a thin photo detector 901 at an angle, and FIG. 9B is a cross-sectional view illustrating a case where light is incident on a thick photo detector 902 at the angle. As shown in FIG. 9A, in the case where light is incident on the thin photo detector 901 at the angle, color mixing does not easily occur because of its geometric arrangement. In contrast, as shown in FIG. 9B, in the case where light is incident on the thick photo detector 902 at the angle, color mixing easily occurs, as compared with the thin photo detector 901, because the light is also incident on an adjacent pixel.

In the second aspect of the present invention, as described above, plasmon resonators or guided-mode resonators are used. A part of each of the guided-mode resonators may be composed of a semiconductor. Accordingly, by decreasing the thickness of a photo detector without decreasing the sensitivity, as in the thin photo detector shown in FIG. 9A, color mixing for light incident at an angle can be prevented. According to the photo detector for detecting the intensity ratio of three colors of RGB using plasmon resonators or guided-mode resonators, which are specific examples of the optical resonant structures in aspects of the present invention, the thickness of the photo detector can be reduced without decreasing the sensitivity, while also maintaining an advantage of realizing an image sensor having a laminated structure in which light loss can be prevented and in which a cutoff frequency of a low-pass filter is high. According to this structure, the occurrence of color mixing and eclipsing can be suppressed, and a satisfactory color separation property can be achieved together with high sensitivity.

The structure and the principle of operation of the photo detector according to the second aspect of the present invention will now be further described with reference to FIG. 7. The photo detector according to the second aspect of the present invention includes a plurality of photoelectric conversion elements (photoelectric conversion layers) and has a structure in which these photoelectric conversion elements are laminated. In addition, optical resonant structures having resonance peaks in different wavelength ranges and functioning as elements for spectral separations are provided in the photoelectric conversion elements.

More specifically, as shown in FIG. 7, plasmon resonators 702 having different resonant frequencies are provided in photoelectric conversion elements 701 made of a plurality of photovoltaic materials or a plurality of photoconductive materials. Typical examples of the photovoltaic materials used in accordance with the second aspect of the present invention include Si for forming a PN junction, semiconductors for forming a PIN junction, and a metal layer and a semiconductor for forming a Schottky junction. Photoconductivity is a phenomenon generally observed in semiconductors, but in order to perform typical photoelectric conversion, for example, a semiconductor such as Si or a Group III-V semiconductor, e.g., GaAs, having an absorption edge in the infrared range (including a range disposed at the longer wavelength side of the infrared range) is suitable for the photoconductive material used in accordance with the second aspect of the present invention. However, in the case where photoelectric conversion is performed by a diabatic process with near-field light, a semiconductor having an absorption edge in the ultraviolet range is also suitable.

Furthermore, photoconductive materials may be selected as follows: A first material having an absorption edge in the infrared range may be used as a material for obtaining conductivity with a red (R) light component. A second material having an absorption edge at a wavelength shorter than that of the first material may be used as a photoconductive material for obtaining conductivity with a green (G) light component. A third material having an absorption edge at a wavelength shorter than that of the second material may be used as a photoconductive material for obtaining conductivity with a blue (B) light component. In this case, it is expected that color separation can be further improved. The sensitivity of photoconductivity is determined by the lifetime and mobility of carriers generated by the photoelectric effect.

Light 703 incident on the photo detector resonates with plasmon resonators corresponding to the wavelength range, and undergoes photoelectric conversion by the photoelectric conversion element disposed near the plasmon resonators. Intensities of incident light in each of the wavelength ranges are output as respective signals of light intensities 704. For example, when resonance peaks of the plasmon resonators are controlled so as to be located in the wavelength ranges corresponding to colors of red (G), green (G), and blue (B), the intensities of each of the colors of R, G, and B can be determined, thus realizing the formation of a color image.

The principle of operation of the photo detector of the second aspect of the present invention will now be described. When light is incident on the photo detector of this aspect of the present invention, the light passes through the photovoltaic material or the photoconductive material and collides with the plasmon resonators. According to the second aspect of the present invention, each of the plasmon resonators is composed of a nanostructure made of a metal, such as silver (Ag), gold (Au), platinum (Pt), or aluminum (Al), or an alloy containing a combination of some or all of these metals. When electromagnetic waves having an appropriate wavelength are incident on a metal having such a structure, plasmon resonance is excited. The plasmon resonance is a phenomenon that is characteristically generated in a substance in which the real part of the dielectric constant is negative, for example, a metal in a light wavelength range, and caused by coupling free electrons in the metal with the electromagnetic field of the incident light.

Figure 10:
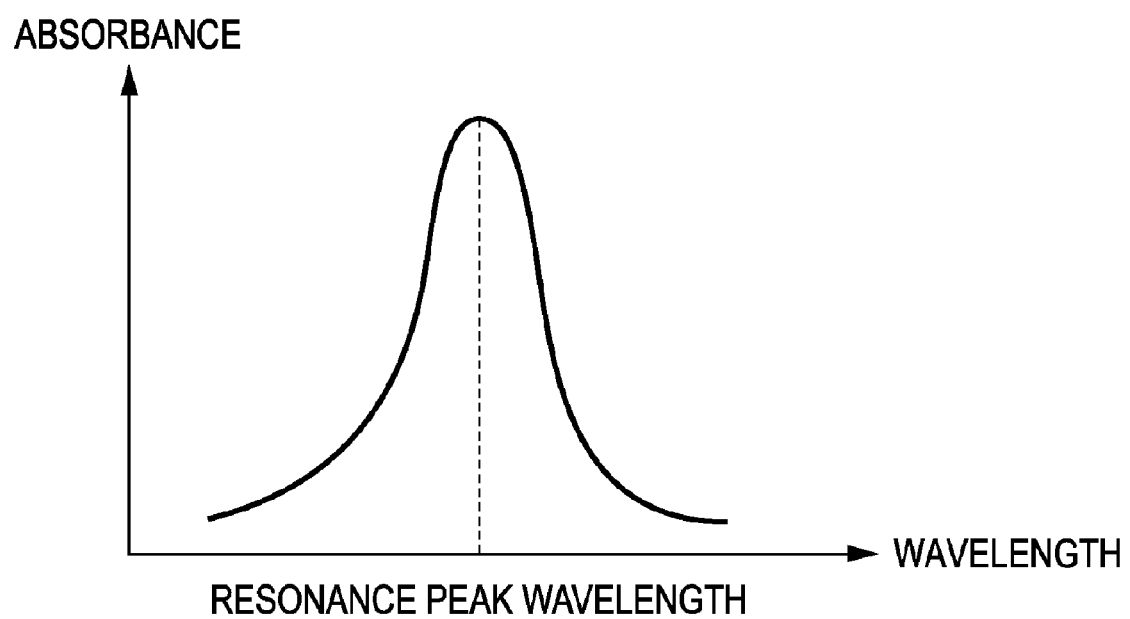
FIG. 10 is a graph schematically illustrating an absorption peak generated by plasmon resonance in accordance with the second aspect of the present invention.

FIG. 10 is a graph illustrating an absorption peak generated by plasmon resonance according to an embodiment of the present invention. As shown in FIG. 10, in a transmission spectrum of a metal resonant structure obtained when white light is incident thereon, a resonance absorption peak due to the structure of the metal resonant structure appears. For example, regarding an aluminum (Al) square dot array having a thickness of 50 nm and embedded inside $SiO_2$, when the length of each side of the square formed by the dots is 150 nm and the array pitch of the dots is 400 nm, a resonance absorption peak is observed at around 650 nm. When the length of each side is 120 nm and the array pitch of the dots is 310 nm, a resonance absorption peak is observed at around 550 nm. When the length of each side is 90 nm and the array pitch of the dots is 250 nm, a resonance absorption peak is observed at around 430 nm.

Because a plasmon resonator interacts with the electromagnetic field near the plasmon resonator, the plasmon resonator has a collision cross section larger than the actual physical size thereof. Therefore, even if light does not directly collide with the plasmon resonator, an interaction may occur. In other words, even when plasmon resonators are not densely arranged in the in-plane direction, by arranging the plasmon resonators at appropriate intervals, incident light can be allowed to fully interact with the plasmon resonators. Among light components that collide with the plasmon resonators, light components in a wavelength range in which the light components resonates with the plasmon resonators are absorbed by resonance, and light components in other wavelength ranges are transmitted and intrude to deeper positions. By laminating a plurality of plasmon resonators, a state in which light components are absorbed in plasmon resonators disposed at different depths with respect to each wavelength range can be realized.

Even when light components are absorbed by plasmon resonators disposed at different depths, it is not sufficient to detect the light intensity. A description will now be made of the reason why the light intensity in each of the wavelength ranges corresponding to resonant peaks of the plasmon resonators can be detected.

In a state in which light is incident on a plasmon resonator and plasmon resonance is generated, light is in a state in which the light is coupled with plasma oscillations of electrons in a metal. In this state, the light serves as near-field light localized in a narrow area near the plasmon resonator. This light in the state of near-field light and light reemitted from the plasmon resonator undergo photoelectric conversion by a peripheral material, and the intensity of incident light is converted into the amount of electric charge. The electric charge is taken out (read out) in the form of a voltage or a current. Thereby, the light intensity in each of the wavelength ranges can be obtained as an electric signal.

In the case where a plasmon resonator is directly in contact with a material that performs photoelectric conversion, and thus the behavior of electrons of the plasmon resonator is changed and plasmon resonance cannot be excited with high efficiency, the following structure can be used.

Specifically, the periphery of the plasmon resonator is coated with a material, such as silica ($SiO_2$), having a high transmissivity for light (electromagnetic waves) and a low electric conductivity (having an electrical insulating property), and the coated plasmon resonator is disposed in the material that performs photoelectric conversion. By coating the plasmon resonator with this material, the plasmon resonator is electrically insulated from the outside but can interact with light. Consequently, in some cases, plasmon resonance can be excited with high efficiency.

Furthermore, a typical semiconductor has a refractive index of about 3.5, whereas glass, such as silica, has a refractive index of about 1.5. Accordingly, the resonance wavelength of a plasmon resonator can be decreased by use of a coating, as compared with a plasmon resonator having the same size without a coating. Conversely, the size of a plasmon resonator for achieving a certain resonance wavelength is increased. Therefore, the ease of production of the plasmon resonator can be improved. Note that incident light has a direction from only the incident direction, but reemitted light is emitted with a directivity depending on the mechanism of reemission. By appropriately designing the structure of the plasmon resonator, the reemitting component in the scattering direction of incident light may be controlled so as to have a directivity in the in-plane direction. Thus, photoelectric conversion can be efficiently performed.

Figure 11:
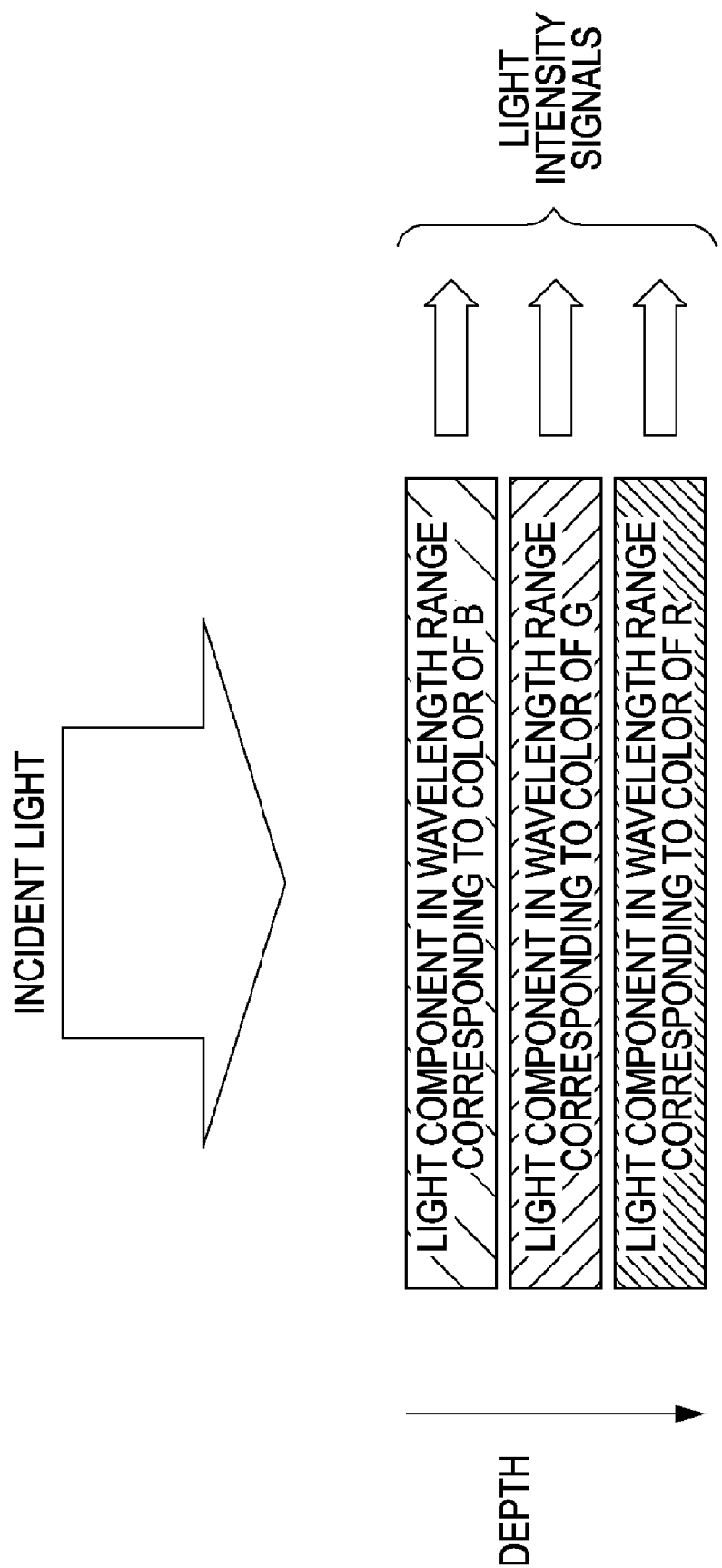
FIG. 11 is a schematic view illustrating a concept of a photo detector and an image sensor according to the second aspect of the present invention.

FIG. 11 is a conceptual view illustrating the function of the photo detector according to the second aspect of the present invention. Incident light components are localized at different depths for different colors by different plasmon resonators. The light intensity in each of the layers is converted to an amount of electric charge by photoelectric conversion. The amount of electric charge is read out as a voltage or current signal, thus obtaining the light intensities corresponding to R, G, and B. The plasmon resonators of this aspect have an active function of retaining light components of different colors in different layers to perform separation of photoelectric conversion regions, rather than a passive function such as a function of an absorption filter.

By performing spectral separation using plasmon resonators, the thickness of a photo detector can be reduced compared with a technique that utilizes the differences in the absorption coefficients of Si. A typical plasmon resonator having a thickness of about 50 nm has an absorbance of about 0.7. This means that 80% of incident light is absorbed in only a single plasmon resonator layer. In contrast, in order for Si to absorb 80% of light having a wavelength of 700 nm, at least 7 µm or more in thickness is necessary. Thus, the capacity of light absorption of a plasmon resonator per unit thickness is extremely high. Accordingly, the thickness of a device can be reduced without decreasing the sensitivity of the device. By reducing the thickness of the device, the generation of, for example, color mixing, eclipsing, and smear can be suppressed. Furthermore, in forming a two-dimensional laminated image sensor, the degree of freedom of the arrangement of device elements and wirings can be increased in such a thin device.

Figure 12:
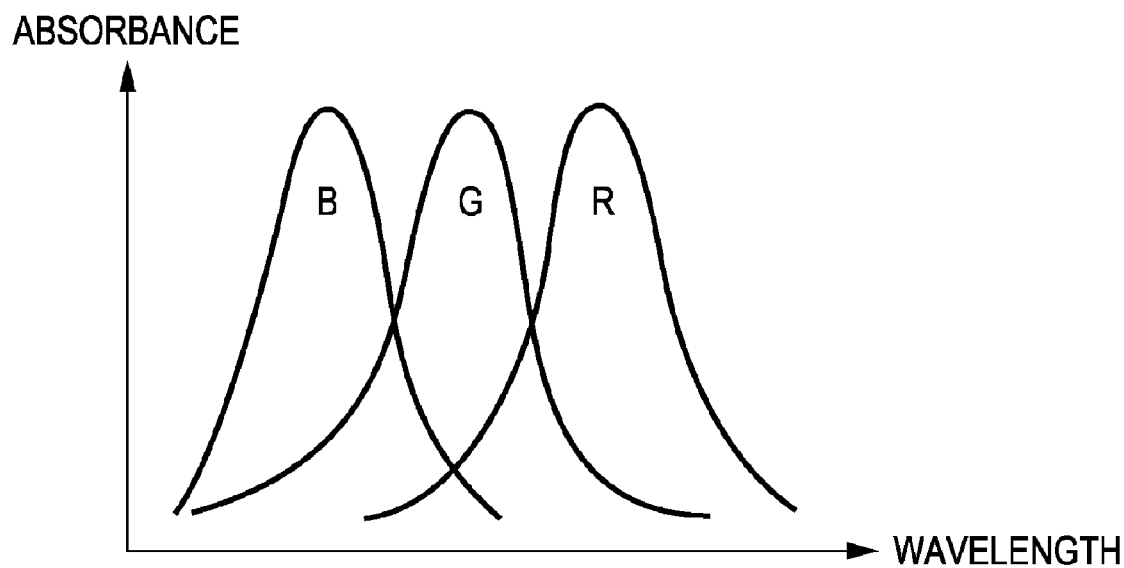
FIG. 12 is a graph schematically showing a spectral sensitivity of the photo detector and the image sensor according to the second aspect of the present invention.
Figure 13:
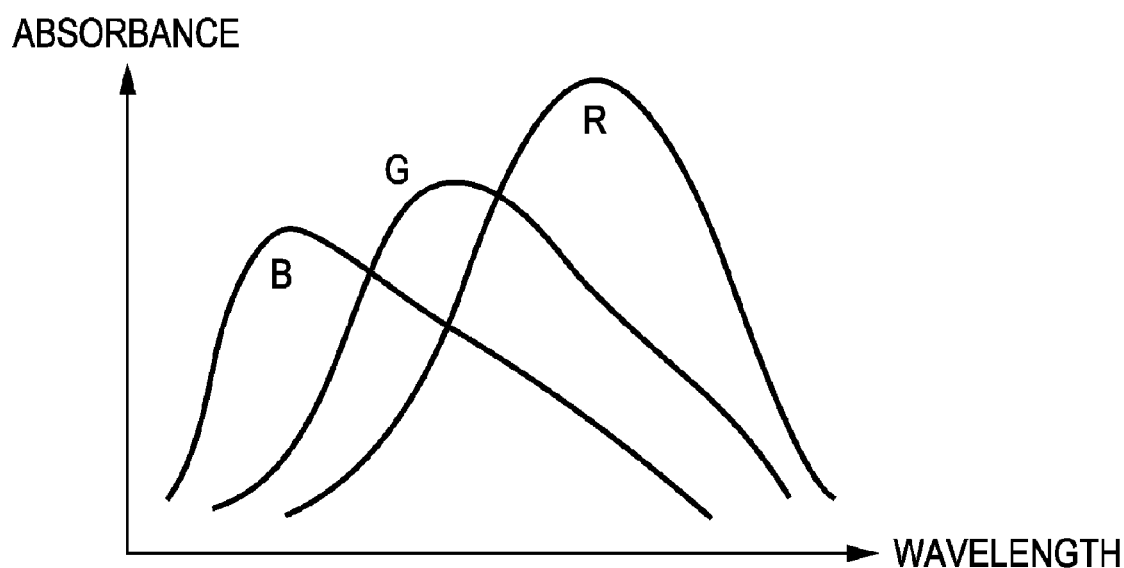
FIG. 13 is a graph schematically showing a spectral sensitivity of a known example of a laminated image sensor.
Figure 14:
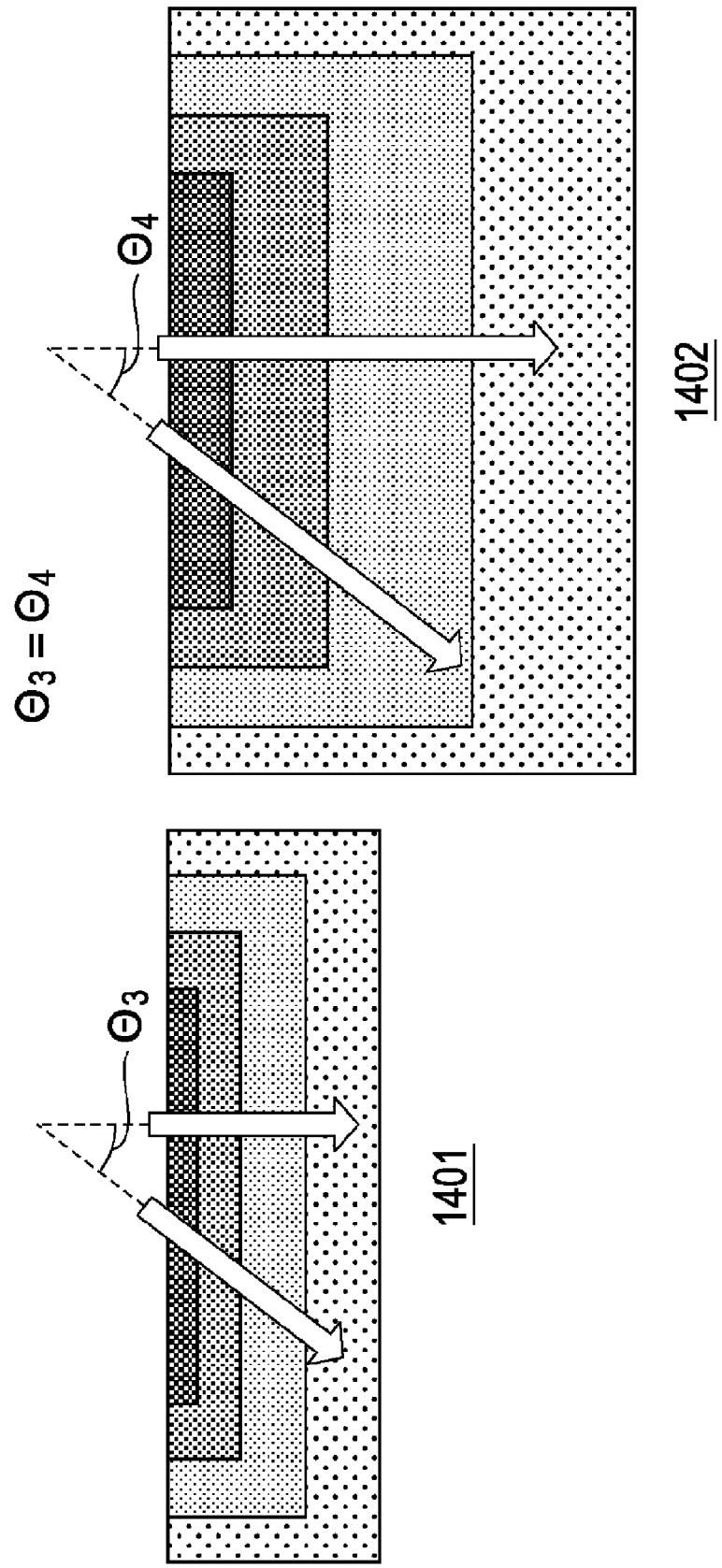
FIG. 14A is a view illustrating a color separation characteristic of a photo detector that performs spectral separation by means of the structure of the photo detector according to the second aspect of the present invention.
FIG. 14B is a view illustrating a color separation characteristic of a photo detector that performs spectral separation by utilizing differences in the absorption coefficients of the materials of the photo detector.

An absorption spectrum of a localized plasmon resonator has been described in FIG. 10. When plasmon resonators that absorb light components having different wavelength ranges are laminated, the absorption spectra schematically shown in FIG. 12 are obtained. FIG. 13 is a graph schematically showing the spectral sensitivity of a known example of a laminated image sensor employing a technique that utilizes the differences in the absorption depths of Si. (The schematic representations are based on actual measurements.) These results show that the device shown in FIG. 12 performs satisfactory color separation compared with the known device shown in FIG. 13. In the photo detector according to the second aspect of the present invention, spectral separation is performed by means of the structure. Accordingly, even when light is incident at an angle, spectral separation can be performed accurately. On the other hand, in the method of performing spectral separation utilizing the difference in the absorption depths (the depths to which light penetrates Si), when light is incident at an angle, even a light component having a certain wavelength may be absorbed in different layers depending on the angle of incidence. Consequently, an error of color separation may occur. In the photo detector according to the second aspect of the present invention, color separation can be accurately performed. FIG. 14A shows a color separation characteristic of a photo detector that performs spectral separation by means of the structure of the photo detector according to this embodiment, and FIG. 14B shows a color separation characteristic of a photo detector that performs spectral separation by utilizing the differences in the absorption coefficients of the material of the photo detector.

As described in the related art, a method of performing color separation using an organic semiconductor has been proposed. However, organic materials have a problem in terms of chemical stability when compared with inorganic materials. Color separation performed by plasmon resonators of this aspect uses the same principle as that of stained glass. As is apparent from the fact that stained glasses in historical architectures do not lose their brightness presenting today's current conditions, the high chemical stability thereof can be understood. High chemical stability is a characteristic required for still cameras. However, such high chemical stability is particularly valuable in movie cameras, in which light is constantly incident on an image sensor.

Current CCDs and CMOS image sensors include not only a light-receiving portion, but also a read-out circuit, an amplifying circuit, and a driving circuit therein. These circuits and a photo detector are formed at the same time. Therefore, these circuits are formed using one or more of the same materials as those used in photoelectric conversion. In the case where these circuits are formed using a semiconductor other than Si, because of an insufficient degree of technical maturity, the devices have a problem in terms of performance, including that of the read-out circuit and that of the amplifying circuit, as compared with the case where Si is used.

In the photo detector according to the second aspect of the present invention, spectral separation is performed not by utilizing a characteristic of a material but by means of the structure of the photo detector. Accordingly, regardless of the type of material used for the photoelectric conversion element, Si, which is advantageous in terms of the performance of the circuits, can be used. In addition, the photo detector according to the second aspect of the present invention controls light not by means of physical properties of the material but by means of the structure of the photo detector. Accordingly, the characteristics of the photo detector can also be easily changed by changing the structure, thus realizing a flexible design.

The photo detectors according to the second aspect of the present invention, which perform spectral separation of incident light by plasmon resonators, are arranged two-dimensionally on a flat surface or a curved surface to form an image sensor. The image sensor had advantages of a laminated structure in which light loss can be prevented and in which a cutoff frequency of a low-pass filter is high. Furthermore, a two-dimensional image sensor that has many excellent characteristics can be realized. More specifically, this image sensor is advantageous in that, for example, the thickness of the photo detector can be reduced, color mixing and eclipsing can be suppressed, the separation of three colors of RGB can be realized together with high sensitivity, and the production process is highly compatible with a process used to form peripheral circuits. The photo detector of this aspect may include a photodiode used in, for example, a CCD and a CMOS image sensor, and does not depend on the methods of electric charge transport, amplification, and read-out.

Furthermore, the following photo-detection method can be realized using the photo detector according to the second aspect of the present invention. Specifically, the photo-detection method includes the steps of preparing a photo detector having a structure in which a plurality of photoelectric conversion layers are laminated, wherein optical resonant structures having resonance peaks in different wavelength ranges are provided in the photoelectric conversion layers so as to correspond to the photoelectric conversion layers; and allowing light to be incident on the photo detector, thereby spectrally separating the incident light by the optical resonant structures, and performing photoelectric conversion with the photoelectric conversion layers. In addition, an imaging method in which image information is obtained from a two-dimensional distribution of the output light intensities can be realized by employing the above photo-detection method.

Embodiments of the present invention will now be described.

First Embodiment

Figure 2:
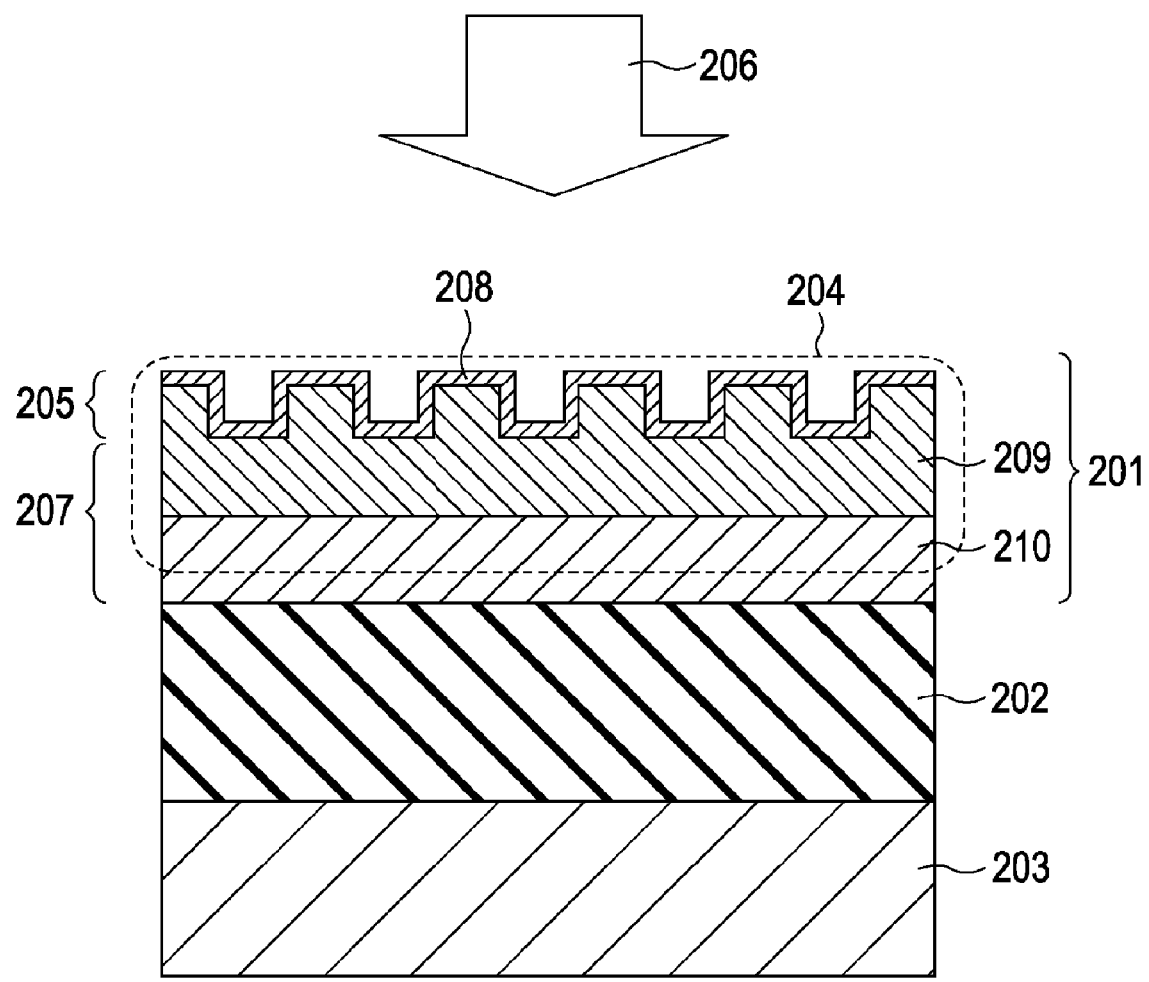
FIG. 2 is a cross-sectional view illustrating a photo detector of a first embodiment.

FIG. 2 shows an example of a photo detector according to the first aspect of the present invention. A photoelectric conversion (layer) area 204 is provided in a silicon-on-insulator (SOI) substrate composed of a Si layer 201, a SiO$_2$ layer 202, and a Si substrate layer 203. A periodic structure 205 composed of two-dimensional irregularities is formed on the top surface of the photoelectric conversion region 204. Depressions of the periodic structure may reach the insulating layer of the SOI substrate or may not reach the insulating layer. A protective film may be optionally provided on the top surface.

When incident light 206 is incident on the photo detector of this embodiment, the light is diffracted by the two-dimensional periodic structure 205 provided on the surface of the photo detector. A light component in a specified wavelength range, depending on parameters of the periodic structure 205, generates guided-mode resonance. Guided-mode resonance is a phenomenon in which light diffracted by a periodic structure is coupled with guided light, thereby the light resonates in the in-plane direction. In this embodiment, the light is resonant in the in-plane direction of the photoelectric conversion material.

It is known that a desired two-dimensional periodic structure can be designed by performing a numerical calculation in accordance with the ratio of a dimension of each of the structures of the periodic structure to the arrangement period. Specifically, when a decrease in the effective refractive index due to each of the structures is negligible, the whole guided-mode resonator including the periodic structure is considered to act as a guiding layer 207. When a decrease in the effective refractive index due to each of the structures is significant, the area ranging from the bottom of the irregularities of the periodic structure to the interface with the insulating layer is considered to act as the guiding layer 207.

A condition in which the wavenumber of light diffracted by the periodic structure is equivalent to the wavenumber of guided light propagating in the guiding layer 207 may be determined. That is, simultaneous equations including a TM zero-order dispersion equation (Equation 1):

$$v = \frac{\pi + \arctan\sqrt{\frac{b}{1-b}} + \arctan\sqrt{\frac{b+\gamma}{1-b}}}{2\sqrt{1-b}} \quad \text{(Equation 1)}$$

and (Equation 2):

$$v = \sqrt{\frac{a^2\beta^2(n_{av}^2 - n_3^2)}{b(n_{av}^2 - n_3^2) + n_3^{2^2}}} \quad \text{(Equation 2)}$$

obtained from definitional equations of v and b are formed. A condition for a first-order diffraction $\beta=2\pi/p$ is substituted to determine the resonant wavelength. In the equations, p=array pitch of depressions, $n_1$=1 (air), $n_2$=refractive index of Si (3.84 at 650 nm, 4.07 at 550 nm, and 4.67 at 450 nm), $n_3$=1.46 (SiO$_2$), $n_{av}=\sqrt{nh^2f+n_2^2(1-f)}$, nh=1 (refractive index of depressions), f=d$\pi r^2$ (filling rate of depressions), d=depth of depressions, a=t/2 (half of the thickness of core layer), $$\gamma = \frac{n_3^2 - n_1^2}{n_{av}^2 - n_3^2}, \quad b = \frac{\left(\frac{\beta}{k}\right)^2 - n_3^2}{n_2^2 - n_3^2}, \quad \text{and}$$

and $$v = \frac{kt}{2}\sqrt{n_2^2 - n_3^2}.$$

Figure 3A:
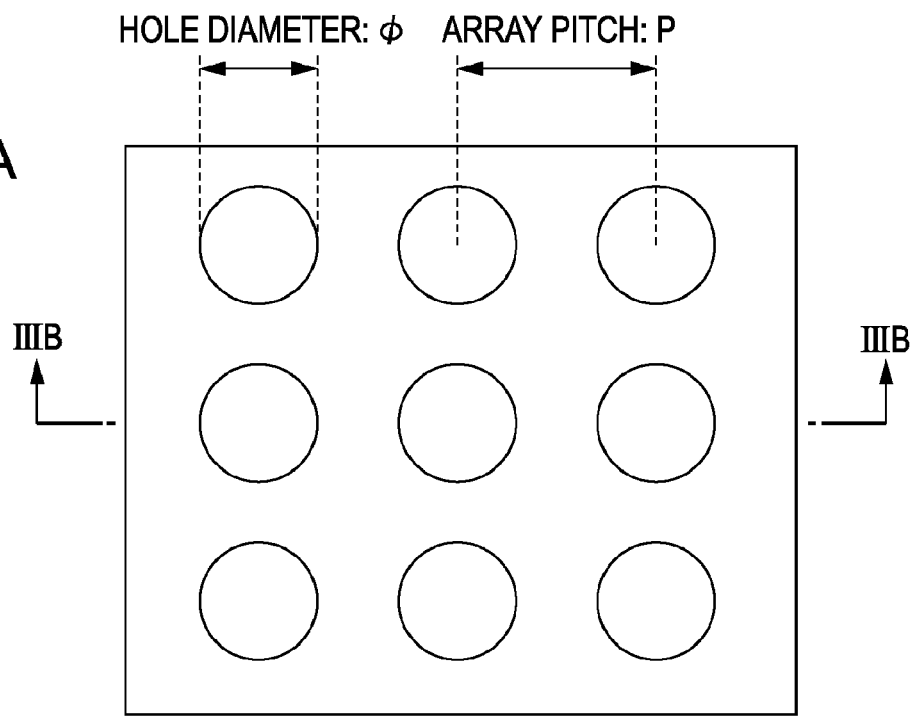
FIGS. 3A and 3B are views showing a structure of the photo detector of the first embodiment and illustrating numeric parameters thereof.
Figure 3B:
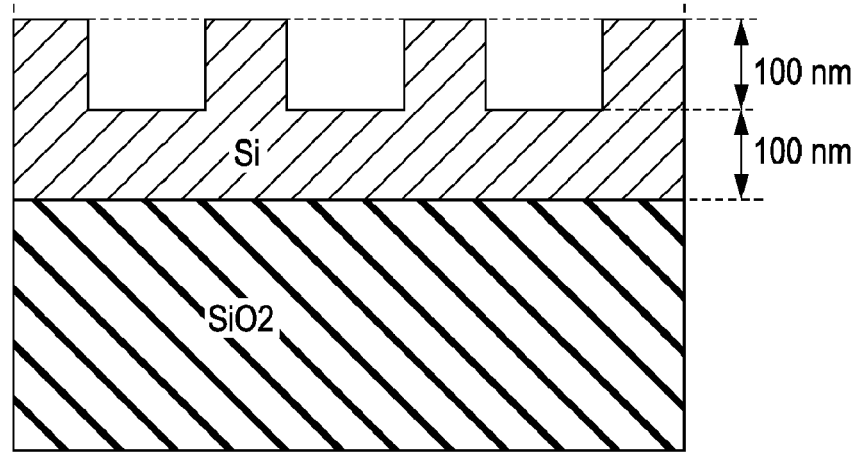

As a result of this calculation, as shown in FIGS. 3A and 3B, when cylindrical holes each having a depth of 100 nm and a diameter of φ are arrayed in the form of a tetragonal lattice at an array pitch P, and the thickness of the guiding layer is 100 nm, the following is determined. Specifically, when [φ, P]=[116 nm, 193 nm], a peak of guided-mode resonance of the lowest order is obtained at 650 nm. When [φ, P]=[91 nm, 152 nm], a peak of guided-mode resonance of the lowest order is obtained at 550 nm. When [φ, P]=[64 nm, 106 nm], a peak of guided-mode resonance of the lowest order is obtained at 450 nm. These are the wavelengths of light components corresponding to the colors of RGB. FIG. 3A is a plan view of a light-receiving surface constituting a surface on which light is incident. FIG. 3B is a cross-sectional view taken along broken line IIIB-IIIB in FIG. 3A.

A light component in a wavelength range generating guided-mode resonance has a large electric-field amplitude in the guiding layer because of confinement due to the refractive index. In other words, the light component is localized near the guiding layer. The guiding layer also functions as a photoelectric conversion layer (208, 209, and 210) prepared by doping a P-type or N-type impurity into Si. Regarding the arrangement of the junction of the photoelectric conversion layer, each area may uniformly extend in the in-plane direction, as shown in FIG. 2. Alternatively, the photoelectric conversion layer may have a structure in the in-plane direction, as shown in an N-type Si area 410 and a P-type Si area 411 of FIG. 4. The arrangement of the junction of the photoelectric conversion layer is not limited as long as the layer has a structure in which photoelectric conversion can be efficiently performed using a light component to be guided.

The localized light component stays in the guiding layer for a long time. Therefore, even when a photoelectric conversion layer having a small thickness is provided, this is similar to a case in which a photoelectric conversion layer having a sufficiently large thickness is provided. On the other hand, most light components having wavelengths that do not generate guided-mode resonance pass through the thin photoelectric conversion layer because of the absorption coefficient of Si, and thus do not undergo photoelectric conversion. Accordingly, the photo detector of this embodiment can have a high spectral sensitivity for a light component in the wavelength range in which guided-mode resonance is generated. In addition, by performing photoelectric conversion of the localized light component, the absorption coefficient is substantially increased.

Furthermore, in this embodiment, since the periodic structure itself is also made of a photoelectric conversion material, an evanescent component expanding at the periphery of the guiding layer can also effectively undergo photoelectric conversion. Accordingly, the efficiency of the photoelectric conversion can be improved. In this embodiment, there is no barrier between the periodic structure and the photoelectric conversion region. Therefore, electrons and holes that have undergone photoelectric conversion inside the periodic structure can be used for light detection to improve the sensitivity, as compared with a device described below in a second embodiment.

In this embodiment, a description has been made of an example in which irregular structures are arrayed in the form of a tetragonal lattice with reference to the drawings. However, the lattice array is not limited to a tetragonal lattice. Alternatively, the periodic structure may be a triangular lattice or a composite period including two or more lattices. A triangular lattice is advantageous in that the polarization dependence is small, compared with a tetragonal lattice. A composite period is advantageous in that the degree of freedom of design is increased because a plurality of resonance peaks can be obtained.

Second Embodiment

Figure 4:
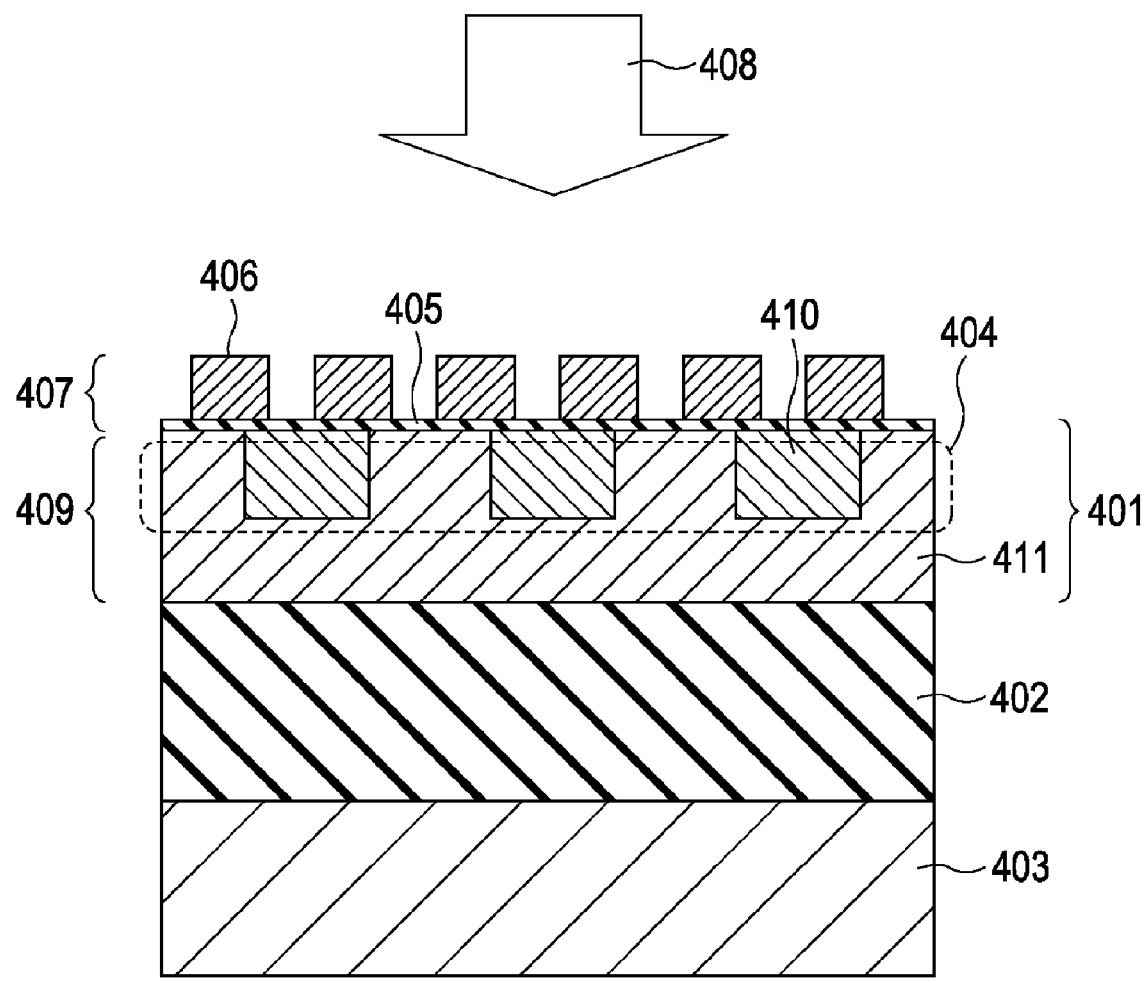
FIG. 4 is a cross-sectional view illustrating a photo detector of a second embodiment.

FIG. 4 shows another embodiment of the photo detector of the present invention. In the photo detector shown in FIG. 4, a photoelectric conversion region 404 is provided in a silicon-on-insulator (SOI) substrate composed of a Si layer 401, a SiO$_2$ layer 402, and a Si substrate layer 403. An insulating film (protective film) 405 made of SiO$_2$ is provided on the top surface of the photoelectric conversion material. Furthermore, a two-dimensional periodic structure 407 made of amorphous Si 406 is formed on the insulating film 405. When incident light 408 is incident on the photo detector of this embodiment, the light is diffracted by the two-dimensional periodic structure 407 provided on the surface of the photo detector. A light component in a specified wavelength range, depending on parameters of the periodic structure 407, generates guided-mode resonance. Guided-mode resonance is a phenomenon in which light diffracted by a periodic structure is coupled with guided light, thereby the light is resonant in the in-plane direction. In this embodiment, the light is resonant in the in-plane direction of the photoelectric conversion material.

A condition in which the wavenumber of light diffracted by the periodic structure 407 is equivalent to the wavenumber of guided light propagating in a guiding layer 409 disposed beneath the periodic structure 407 may be determined. That is, simultaneous equations including a TM zero-order dispersion equation (Equation 3):

$$v = \frac{\pi + \arctan\sqrt{\frac{b}{1-b}} + \arctan\sqrt{\frac{b+\gamma}{1-b}}}{2\sqrt{1-b}} \quad \text{(Equation 3)}$$

and (Equation 4):

$$v = \sqrt{\frac{a^2\beta^2(n_2^2 - n_3^2)}{b(n_2^2 - n_3^2) + n_3^2}} \quad \text{(Equation 4)}$$

obtained from definitional equations of v and b are formed. A condition for a first-order diffraction $\beta = 2\pi/p$ is substituted to determine the resonant wavelength. In the equations, p=array pitch of depressions, $n_1$=1 (air), $n_2$=refractive index of Si (3.84 at 650 nm, 4.07 at 550 nm, and 4.67 at 450 nm), $n_3$=1.46 (SiO$_2$), $n_{av}=\sqrt{nh^2 f + n_2^2(1-f)}$, nh=1 (refractive index of depressions), f=$\pi r^2$ (filling rate of depressions), a=t/2 (half of the thickness of core layer), $$\gamma = \frac{n_3^2 - n_{av}^2}{n_2^2 - n_3^2}, \quad b = \frac{\left(\frac{\beta}{k}\right)^2 - n_3^2}{n_2^2 - n_3^2}, \text{ and } v = \frac{kt}{2}\sqrt{n_2^2 - n_3^2}.$$

As a result of this calculation, as shown in FIGS. 5A and 5B, when cylindrical holes each having a depth of 100 nm and a diameter of φ are arrayed in the form of a tetragonal lattice at an array pitch P, and the thickness of a guiding layer is 200 nm, the following is determined. Specifically, when [φ, P]= [107 nm, 179 nm], a peak of guided-mode resonance of the lowest order is obtained at 650 nm. When [φ, P]=[85 nm, 141 nm], a peak of guided-mode resonance of the lowest order is obtained at 550 nm. When [φ, P]=[59 nm, 99 nm], a peak of guided-mode resonance of the lowest order is obtained at 450 nm. These are the wavelengths of light corresponding to the colors of RGB. FIG. 5A is a plan view of a light-receiving surface constituting a surface on which light is incident. FIG. 5B is a cross-sectional view taken along broken line VB-VB in FIG. 5A.

A light component in a wavelength range generating guided-mode resonance has a large electric-field amplitude in the guiding layer because of confinement due to the refractive index. In other words, the light component is localized near the guiding layer. The guiding layer also functions as a photoelectric conversion layer (410 and 411) prepared by doping a P-type or N-type impurity into Si. Regarding the arrangement of the junction in the photoelectric conversion layer, each area may uniformly extend in the in-plane direction, as shown in FIG. 2. Alternatively, the photoelectric conversion layer may have a structure in the in-plane direction, as shown in the N-type Si area 410 and the P-type Si area 411 of FIG. 4.

In this embodiment, most of the localized light component stays in the guiding layer for a long time. Therefore, even when a photoelectric conversion layer having a small thickness is provided, this is similar to a case where a photoelectric conversion layer having a sufficiently large thickness is provided. On the other hand, most light components having wavelengths that do not generate guided-mode resonance pass through the thin photoelectric conversion layer because of the absorption coefficient of Si, and thus do not undergo photoelectric conversion.

A photo detector or an image sensor is often formed on a Si substrate. One of the reasons for this is that a Si substrate has excellent properties as a semiconductor device in terms of carrier mobility, dark current, and the like. These properties can be significantly degraded by the mixing of impurities. In the photo detector of this embodiment, the periodic structure for changing the spectral sensitivity is formed using Si, which is the same material as the substrate and the photoelectric conversion material. Accordingly, degradation of properties caused by the mixing of impurities can be suppressed. Furthermore, by using amorphous Si, which can be easily deposited to form a film, the degree of process freedom can be increased, and an increase in the production cost can be suppressed.

Third Embodiment

Figure 6A:
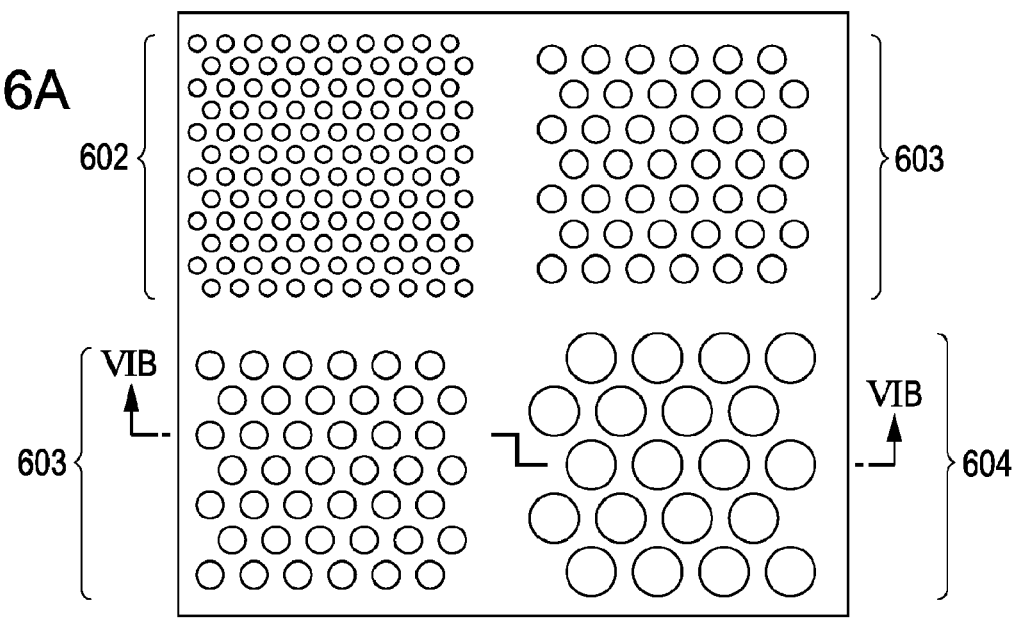
FIGS. 6A and 6B are views illustrating an image sensor of a third embodiment.
Figure 6B:
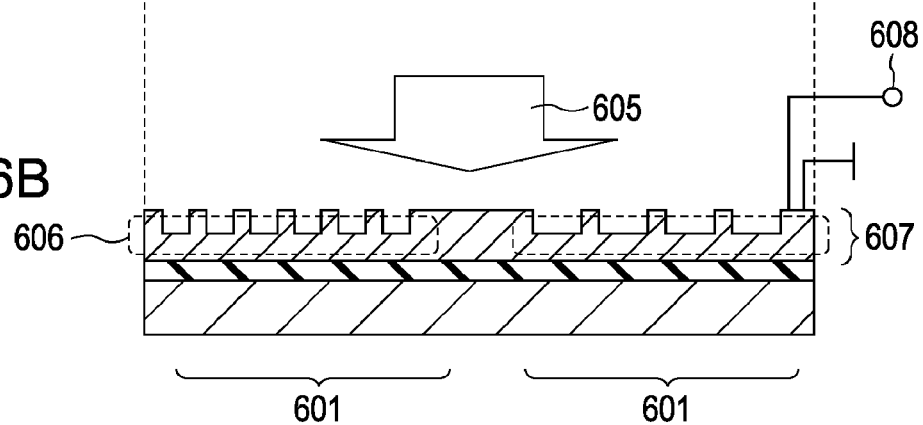

An embodiment of an image sensor according to the first aspect of the present invention is shown in FIGS. 6A and 6B. FIG. 6A is a plan view of a light-receiving surface constituting a surface on which light is incident. FIG. 6B is a cross-sectional view taken along broken line VIB-VIB in FIG. 6A. In the device shown in FIGS. 6A and 6B, a plurality of photo detectors 601 for performing a two-dimensional imaging are arranged. An irregular periodic structure is formed on the surface of each of the photo detectors 601. An area 602 that resonates with a red (R) light component, an area 603 that resonates with a green (G) light component, and an area 604 that resonates with a blue (B) light component are provided. For example, by forming periodic structures on the basis of the parameters described in the first embodiment, peak wavelengths can be provided at 450 nm, 550 nm, and 650 nm.

As described in the first embodiment, regarding incident light 605 diffracted by the irregular structures, light components having wavelengths respectively corresponding to each of the structures generates guided-mode resonance and are localized near a guiding layer 607. Since a photoelectric conversion region 606 of a photodiode of this embodiment overlaps with the area of the guiding layer 607 and has a small thickness, the photoelectric conversion region 606 has an intrinsic spectral sensitivity due to the structure thereof. The spectral sensitivity of each of the photodiodes is controlled so as to be suitable for color separation in the visible range. Signals obtained by photoelectric conversion by each of the photodiodes are read out by a readout circuit 608. Accordingly, the intensities of light incident on each of the photodiodes are determined.

Furthermore, by referring colors obtained from adjacent photodiodes corresponding to other colors, a two-dimensional (2D) color image may be reconstructed. In the image sensor of the present embodiment, the photo detector itself has a spectral sensitivity due to the structure thereof. Therefore, color filters, which are generally used for color separation, are not necessary. Consequently, the thickness of the pixel structure can be reduced, and the occurrence of eclipsing and color mixing with adjacent pixels can be suppressed.

Fourth Embodiment

Figure 15:
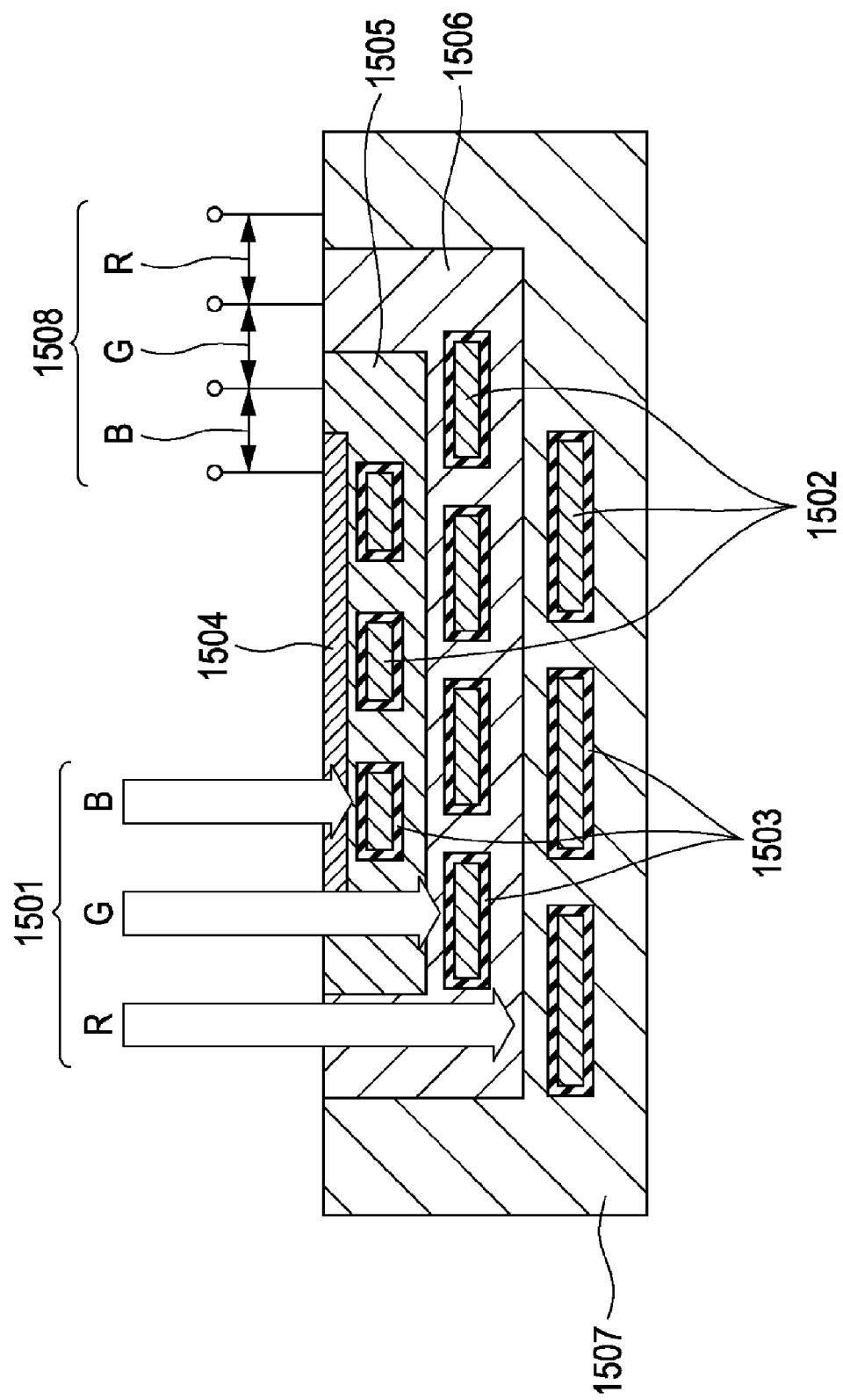
FIG. 15 is a cross-sectional view illustrating an example of a structure of a photo detector of a fourth embodiment.

An embodiment of a photo detector described in the second aspect of the present invention will now be described. FIG. 15 shows an example of the structure of a photo detector of this embodiment. In FIG. 15, reference numeral 1501 denotes incident light, reference numeral 1502 denotes a plasmon resonator, reference numeral 1503 denotes a transparent insulating material, reference numeral 1504 denotes an n-type semiconductor, reference numeral 1505 denotes a p-type semiconductor, reference numeral 1506 denotes an n-type semiconductor, reference numeral 1507 denotes a p-type semiconductor substrate, and reference numeral 1508 denotes a readout portion.

In this embodiment, when the incident light 1501 is incident on a photo detector, the incident light 1501 collides with the plasmon resonators 1502, which are disposed in a photovoltaic material composed of a semiconductor forming a PN junction that causes photoelectric conversion. As described above, the collision occurs in an area larger than the actual physical size of each of the plasmon resonators. Among the collided light components, a light component in a wavelength range corresponding to the resonant wavelength of a plasmon resonator causes plasmon resonance, and generated near-field light undergoes photoelectric conversion by peripheral photovoltaic material. In order to prevent electrical contact between the photovoltaic material and a plasmon resonator or diffusion of the plasmon resonator into the photovoltaic material, the plasmon resonator may be coated with a transparent insulating material 1503 such as silica.

In order to receive light components of three colors of RGB, it is necessary to laminate PN junctions. In this embodiment, from the surface, an n-type semiconductor 1504, a p-type semiconductor 1505, an n-type semiconductor 1506, and a p-type semiconductor substrate 1507 are laminated in that order. When light is incident on the PN junctions and causes a photoelectric effect, an electric charge is generated at both ends of the photovoltaic material. By measuring the amount of this electric charge as a voltage or current signal with the readout portion 1508, the intensity of the incident light can be determined.

Two-dimensional arrangement of these photo detectors can provide an image sensor. In general, these photo detectors are arranged on a two-dimensional flat surface. However, in order to cancel out an aberration of the optical system, the photo detectors can be two-dimensionally arranged on a three-dimensional curved surface, as in the human retina. The intensities of the incident light of the RGB three colors are obtained from the photo detectors, and thus, a two-dimensional color image can be obtained.

The photo detector of this embodiment can be produced by a typical semiconductor process. In order to provide the plasmon resonators, which are a feature of this device, inside the semiconductor layers, the following method using, for example, Si as the semiconductor and silver (Ag) metal as the plasmon resonators can be employed.

First, a single-crystal silicon (Si) layer is prepared so as to have a thickness of about half the thickness of a desired semiconductor layer. Silver (Ag) is then disposed as plasmon resonators on the Si layer. Various types of methods, such as a top-down process or a bottom-up process, can be employed for disposing Ag on the Si layer. For example, a solution prepared by dispersing Ag nanoparticles in a solvent is applied on the Si layer by spin coating to form a thin film, and the solvent is then removed. Alternatively, a Ag film may be patterned by electron-beam lithography.

After the resulting Ag portion is disposed on the Si layer, amorphous silicon (a-Si) is deposited, thus allowing the Ag portion to be disposed in Si. By performing laser annealing of the a-Si, the a-Si can be converted to single-crystal silicon by a phenomenon of solid-phase crystallization (SPC) or solid-phase epitaxy (SPE). Amorphous silicon deposited on the upper part of the Ag portion can also be converted to single-crystal silicon because about several micrometers of lateral overgrowth has occurred. By converting a-Si to single-crystal silicon, the semiconductor properties, such as carrier mobility, can be improved. Alternatively, during the application of Ag, seed crystals of Si may be formed at the same time, and then grown. Thus, Ag can be disposed in single-crystal Si.

The photo detector of this embodiment has a structure produced by alternately depositing a p-type semiconductor and an n-type semiconductor. The p-type semiconductor is prepared by doping a slight amount of a Group III element into Si. The n-type semiconductor is prepared by doping a slight amount of a Group V element into Si. The addition of these impurities into Si can be performed by, for example, diffusion, implantation, or mixing of a dopant gas during deposition. In order to receive light components of three colors of RGB, Ag portions having different dimensions and resonated with any of the RGB light components are disposed in Si. Thus, photoelectric conversion layers corresponding to RGB can be formed. In FIG. 15, light is incident from the n-type semiconductor substrate 1504 side. Alternatively, light may be incident from the p-type semiconductor substrate 1507 side. In this case, the plasmon resonators 1502 may be arranged in the order of, from the light incident side, R, G, and B.

Fifth Embodiment

Figure 16:
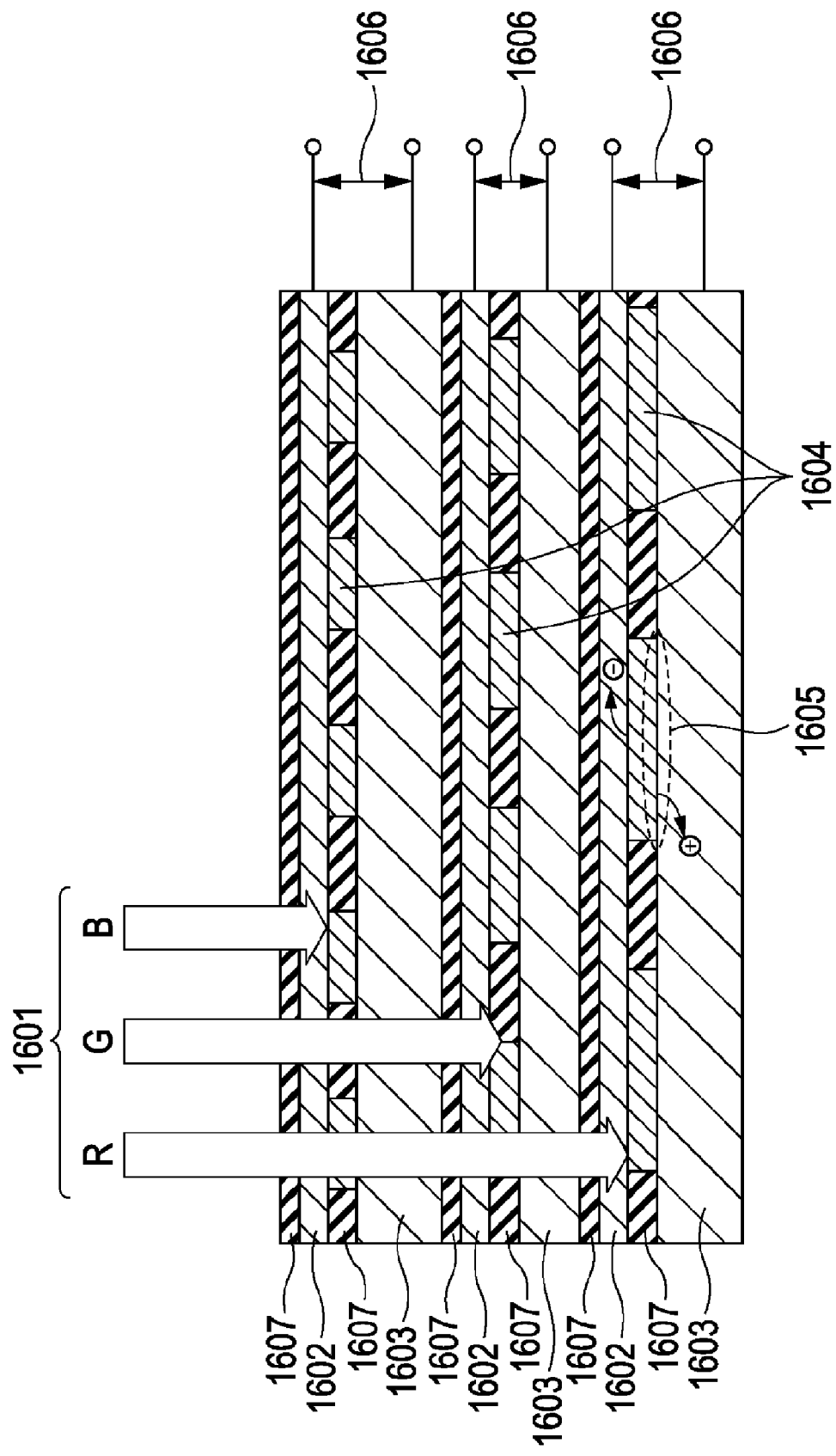
FIG. 16 is a cross-sectional view illustrating an example of a structure of a photo detector of a fifth embodiment.

FIG. 16 shows an example of the structure of a photo detector according to the second aspect of the present invention. In FIG. 16, reference numeral 1601 denotes incident light, reference numeral 1602 denotes a transparent conductive film, reference numeral 1603 denotes a semiconductor layer, reference numeral 1604 denotes a plasmon resonator, reference numeral 1605 denotes a Schottky junction region, reference numeral 1606 denotes a readout portion, and reference numeral 1607 denotes a transparent insulating material.

In the device of this embodiment, when the incident light 1601 is incident on the photo detector, the incident light 1601 passes through the transparent conductive film 1602 and collides with the plasmon resonators 1604 disposed on the semiconductor layers 1603. As described above, the collision occurs in an area larger than the actual physical size of each of the plasmon resonators. Among the collided light components, a light component in a wavelength range corresponding to the resonant wavelength of the respective plasmon resonators causes plasmon resonance and generates near-field light. In this embodiment, the interface between a metal of each of the plasmon resonators 1604 and the semiconductor layer 1603 forms the Schottky junction region 1605, which functions as a photovoltaic material. That is, the metal has both a spectroscopic function due to plasmon resonance and the function of serving as the metal portion of the Schottky junction.

The near-field light generated near the plasmon resonators undergo photoelectric conversion by the Schottky junction formed at the interface between each of the plasmon resonators 1604 and the corresponding semiconductor layer 1603. The transparent conductive film 1602 provided on the plasmon resonators is transparent at frequencies of light but transmits low-frequency electromagnetic waves. Therefore, in considering plasmon resonance, which is a resonance occurring at frequencies of light, the transparent conductive film 1602 can be treated as an insulator. On the other hand, the transparent conductive film 1602 behaves as a metal in low frequencies. Therefore, the transparent conductive film 1602 can be treated as a metal when carriers generated by the Schottky junctions are read out. When light is incident on the Schottky junctions and causes a photoelectric effect, an electric charge is generated at both ends of the photovoltaic material. By measuring the amount of electric charge as a voltage signal or a current signal with the readout portion 1606, the intensity of the incident light can be determined.

According to this embodiment, a metal surface, on which the intensity of near-field light is the highest, can also function as a photoelectric conversion region, and, thus, high sensitivity can be realized. In order to receive light components of three colors of RGB, three photoconductive material layers are laminated, and each of the layers are separated by the transparent insulating material 1607. By arranging the above-described photo detectors two-dimensionally, imaging can be performed. In general, the photo detectors are arranged on a two-dimensional flat surface. However, in order to cancel out an aberration of the optical system, the photo detectors can be two-dimensionally arranged on a three-dimensional curved surface, as in the human retina. The intensities of the incident light of the RGB three colors are obtained from the photo detectors, and thus, a two-dimensional color image can be obtained.

Figure 17:
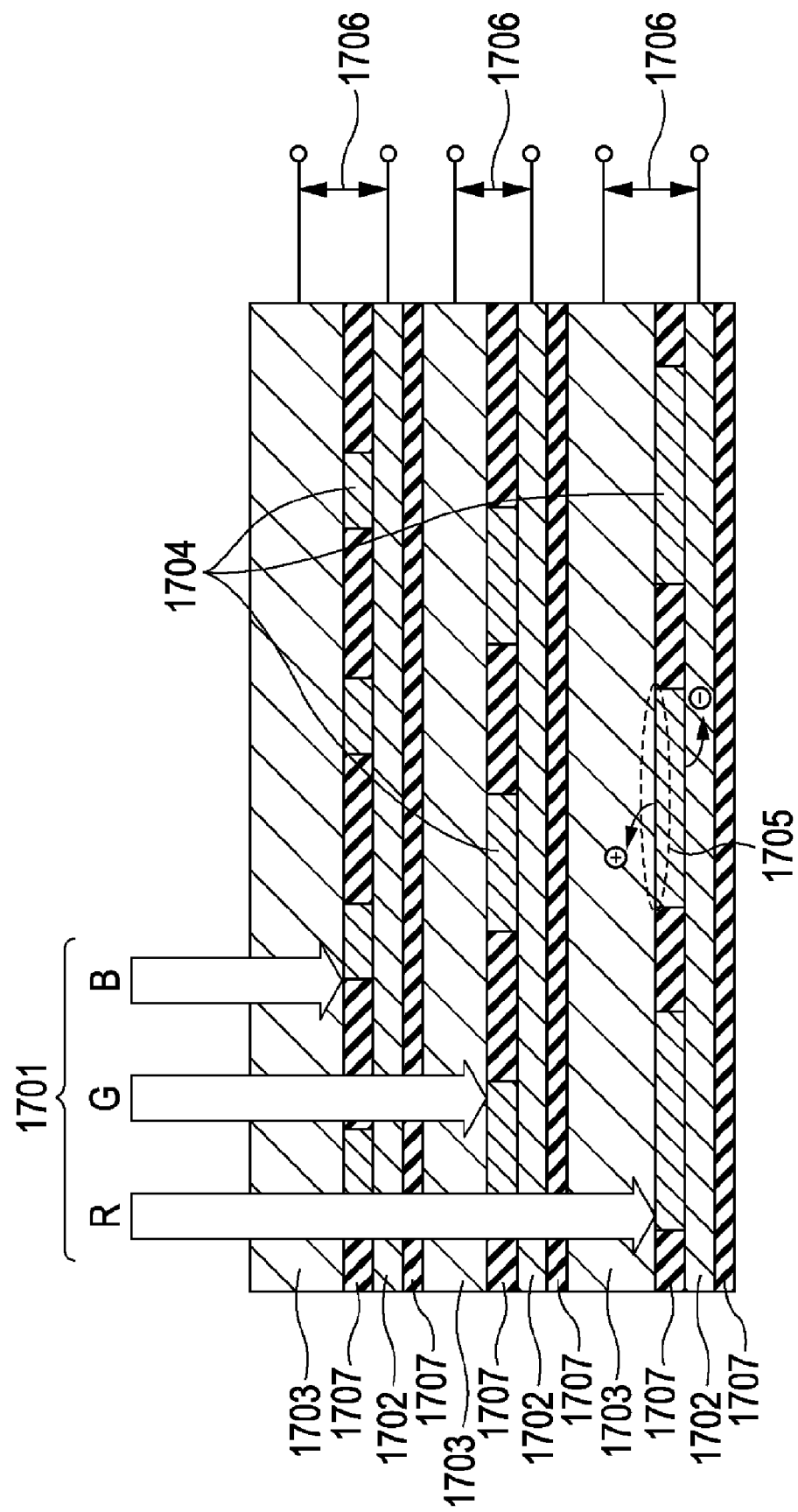
FIG. 17 is a cross-sectional view illustrating an example of a structure in which a transparent electroconductive film in the structure of the fifth embodiment is arranged in a direction opposite to that shown in FIG. 16 with respect to a direction in which light of a plasmon resonator is incident.

In FIG. 16, the transparent conductive film 1602 is provided at the light incident side of the plasmon resonators. Alternatively, as shown in FIG. 17, a transparent conductive film 1702 may be provided at the reverse side with respect to the incident direction of light. However, in general, the refractive index of such a transparent conductive film is smaller than the refractive index of a semiconductor. Accordingly, when a structure that resonates at a certain wavelength is prepared, the size of the structure can be increased. Therefore, such a structure can be more easily prepared when the transparent conductive film is provided at the light incident side.

The photo detector of this embodiment can be produced by a typical semiconductor process. In order to provide the plasmon resonators, which are a feature of this device, inside the semiconductor layers, the following method using, for example, single-crystal Si as a semiconductor can be employed.

Figure 18:
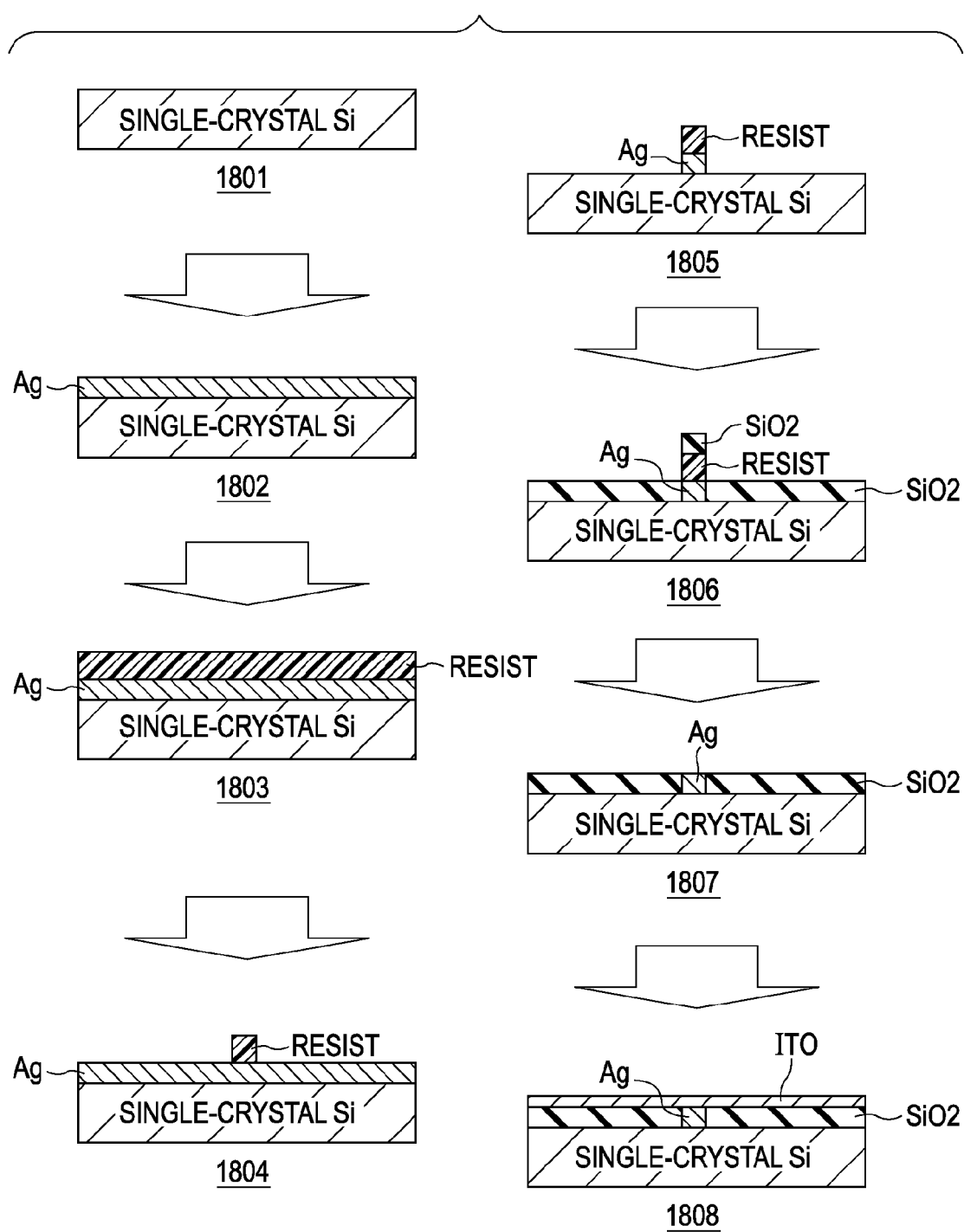
FIG. 18 includes cross-sectional views illustrating a process flow of a method of producing the photo detector of the fifth embodiment.

FIG. 18 shows a process flow of a method of producing the photo detector of this embodiment. First, silver (Ag), which is a metal or an alloy constituting a plasmon resonator, is deposited on a single-crystal Si substrate 1801 by, for example, sputtering or vapor deposition (1802). A resist material is formed on the Ag film (1803). A resist pattern corresponding to a desired shape of the plasmon resonator is then formed by a fine processing technology such as lithography, e.g., electron-beam lithography or near-field lithography, or imprinting (1804).

Etching is then performed using the resist as a mask (1805) to form the plasmon resonator. Subsequently, $SiO_2$ is deposited thereon as a transparent insulating material by, for example, sputtering (1806). Subsequently, the resist and the $SiO_2$ formed on the resist are removed by lift-off. Consequently, the surface of the device is planarized to expose Ag (1807). Subsequently, ITO is deposited thereon as a transparent conductive material by, for example, sputtering. Accordingly, in the photo detector of the present embodiment, a layer corresponding to a certain wavelength range can be formed (1808). In order to receive light components of RGB three colors, plasmon resonators having different sizes are formed so as to correspond to the RGB three colors, respectively. Specifically, semiconductor layers containing plasmon resonators having the structures resonate with light components corresponding to R, G, and B are laminated.

Sixth Embodiment

Figure 19:
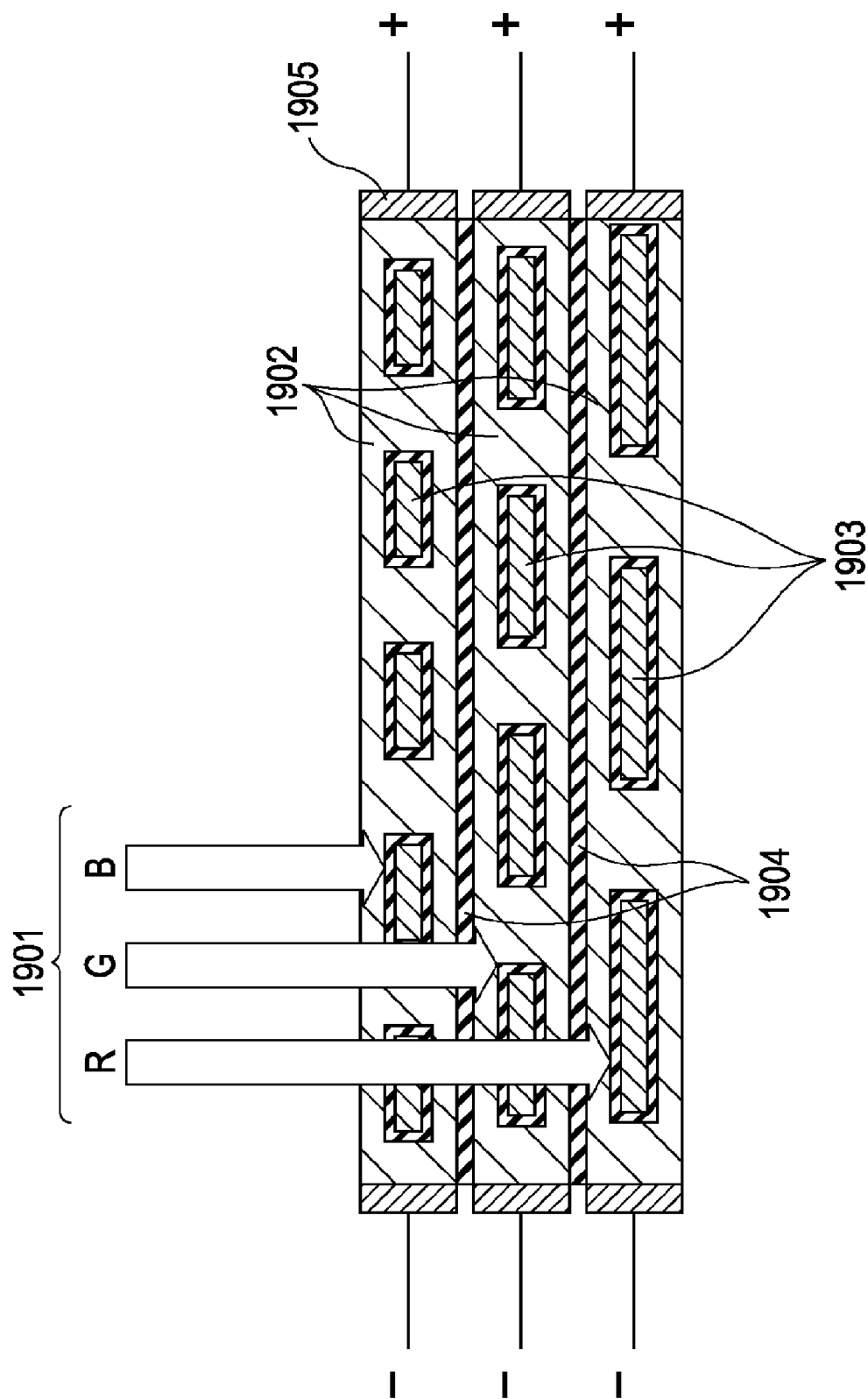
FIG. 19 is a cross-sectional view illustrating an example of a structure of a photo detector of a sixth embodiment.

FIG. 19 is an example of the structure of a photo detector of a sixth embodiment. In FIG. 19, reference numeral 1901 denotes incident light, reference numeral 1902 denotes a photoconductive material, reference numeral 1903 denotes a plasmon resonator, reference numeral 1904 denotes a transparent insulating material, and reference numeral 1905 denotes an electrode.

In this embodiment, when the incident light 1901 is incident on the photo detector, the incident light 1901 collides with the plasmon resonators 1903 in the photoconductive material 1902. As described above, the collision occurs in an area larger than the actual physical size of each of the plasmon resonators. Among the collided light components, a light component in a wavelength range corresponding to the resonant wavelength of a plasmon resonator causes plasmon resonance, and generated near-field light undergoes photoelectric conversion by the peripheral photoconductive material 1902. In order to prevent electrical contact between the photoconductive material and a plasmon resonator or diffusion of the plasmon resonator into the photoconductive material, the plasmon resonator is coated with a transparent insulating material 1904 such as silica ($SiO_2$).

When light is incident on the photoconductive material and causes a photoelectric effect, electrons are excited from the valence band to the conduction band, and the photoconductive material exhibits photoconductivity. By providing an electric potential difference to the electrodes 1905 disposed at both ends of the photoconductive material and measuring the conductivity, the intensity of the incident light can be determined.

In order to determine the light intensity from the conductivity, each of the electrodes provided at both ends of the photoconductive material may be connected to the photoconductive material by an ohmic junction. In order to receive light components of three colors of RGB, three photoconductive material layers are laminated. By arranging these photo detectors two-dimensionally, imaging can be performed. In general, these photo detectors are arranged on a two-dimensional flat surface. However, in order to cancel out an aberration of the optical system, the photo detectors can be two-dimensionally arranged on a three-dimensional curved surface, as in the human retina. The photo detectors can be produced by the same method as that used in the fourth embodiment and the fifth embodiment.

Seventh Embodiment

Figure 20:
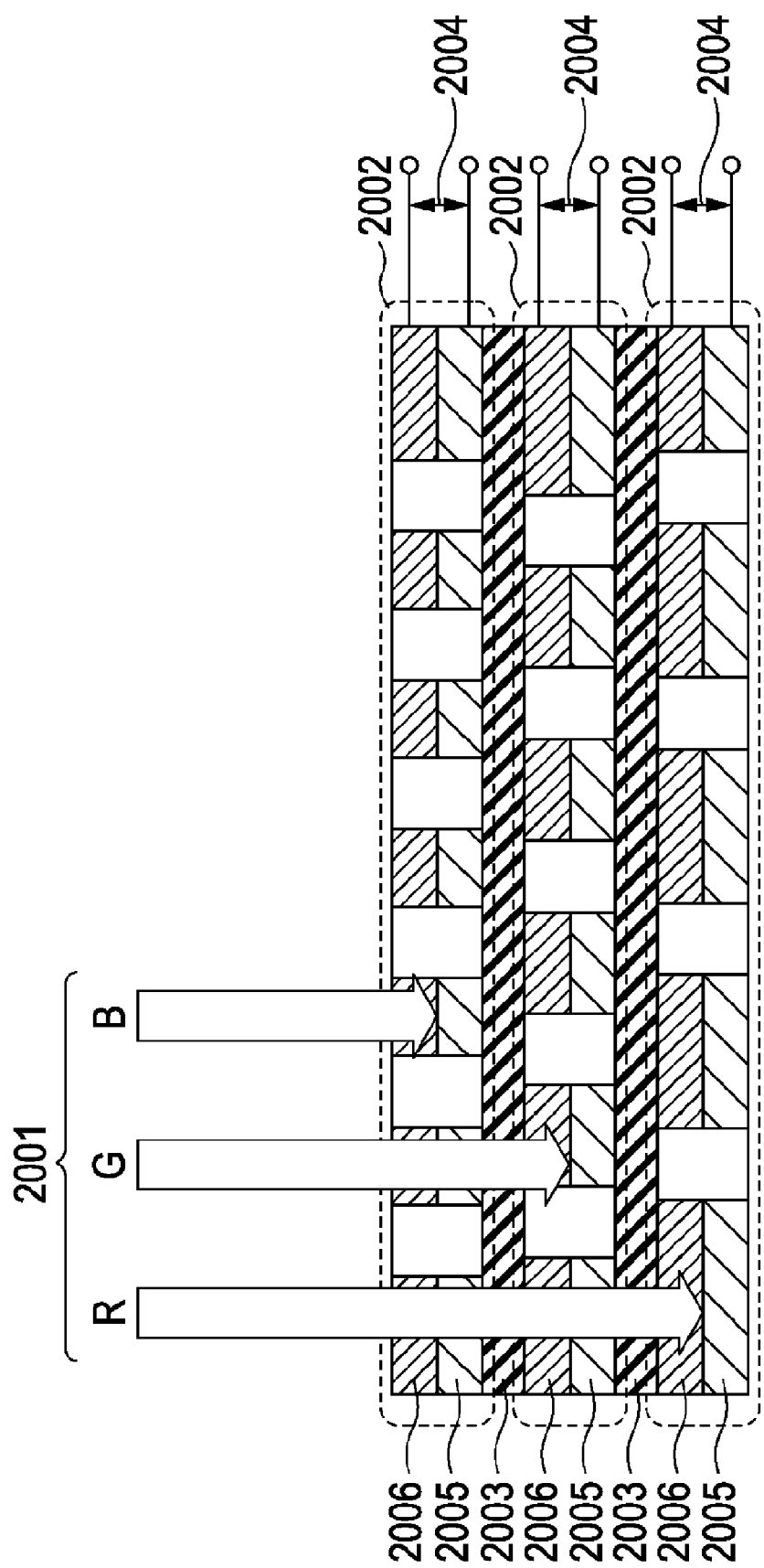
FIG. 20 is a cross-sectional view illustrating an example of a structure of a photo detector of a seventh embodiment.

FIG. 20 shows an example of the structure of a photo detector of a seventh embodiment. In FIG. 20, reference numeral 2001 denotes incident light, reference numeral 2002 denotes a guided-mode resonator, reference numeral 2003 denotes a transparent insulating material, reference numeral 2004 denotes a readout portion, reference numeral 2005 denotes a p-type region, and reference numeral 2006 denotes an n-type region.

When the incident light 2001 is incident on a photo detector, the incident light 2001 is incident on a guided-mode resonator 2002 made of a photovoltaic material. Among the light components incident on the guided-mode resonator 2002, a light component having a wavelength corresponding to the structure of the guided-mode resonator 2002 causes resonance. In the light component having the resonance wavelength, a transmitted component and diffraction and scattering components cancel out each other by interference, and the light component becomes light localized in the in-plane direction.

This phenomenon is guided-mode resonance. Light components that do not resonate with the structure of the guided-mode resonator pass through the guided-mode resonator and the transparent insulating material 2003, and are incident on another laminated guided-mode resonator 2002 having a different structure. Consequently, a state in which a light component corresponding to the structure of each of the guided-mode resonators is localized near the structure is obtained. Photoelectric conversion of these light components is performed in the layers having different structures respectively corresponding to light components of RGB. The amounts of resulting electric charge are measured as voltage or current signals from the readout portions 2004, and, thus, the intensities of the incident light components corresponding to RGB can be determined.

Figure 21:
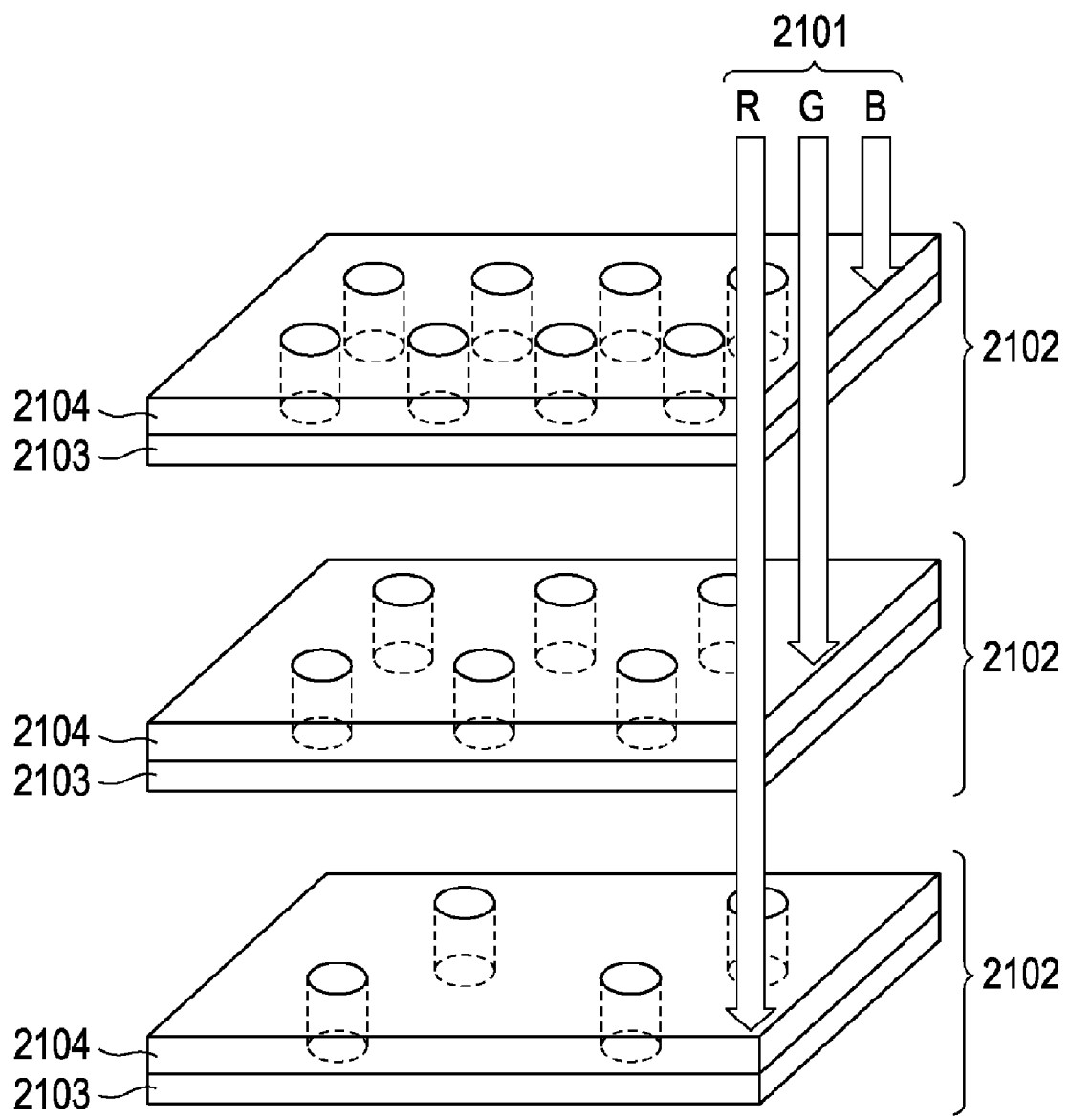
FIG. 21 is a view illustrating a relationship between an arrangement of optical resonant structures and sites where light is absorbed in accordance with the seventh embodiment.

FIG. 21 shows the relationship between the arrangement of optical resonant structures and sites where light is absorbed in this embodiment. In FIG. 21, for the sake of convenience, guided-mode resonators 2102 are shown so as to be arranged at certain intervals. Each of the guided-mode resonators 2102 constituting a photo detector of this embodiment has a structure in which a p-type region 2103 and an n-type region 2104 of a semiconductor are joined, and functions as a photovoltaic material. More specifically, the element for spectral separation itself also functions as a photoelectric conversion element. In a state in which guided-mode resonance is generated, light is localized in the plane. This light is localized in the in-plane direction of the guided-mode resonators with an electromagnetic field distribution that depends on the structure of the resonators.

By designing a structure in which a position where the electromagnetic field intensity is high is matched with a position of a depletion layer of a PN junction, high sensitivity can be realized. The electromagnetic field intensity distribution is determined by the structure of the guided-mode resonator, and the position of the depletion layer is determined by the boundary between a p-type semiconductor and an n-type semiconductor. Both the electromagnetic field intensity distribution and the position of the depletion layer can be appropriately changed by controlling the production process.

Figure 22:
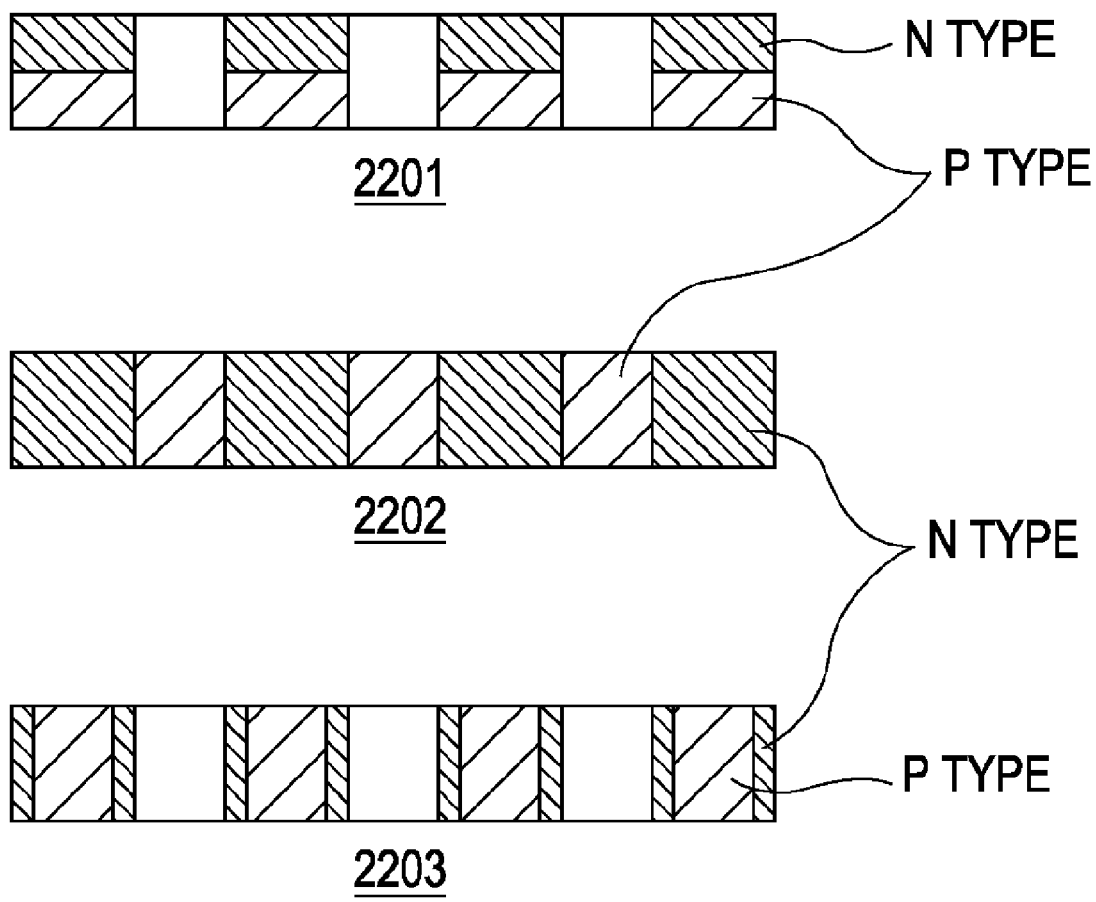
FIG. 22 includes views illustrating variations in a boundary of a PN junction in accordance with the seventh embodiment.

FIG. 22 includes views illustrating variations in the boundary of a PN junction. In a first junction structure (2201), a second junction structure (2202), and a third junction structure (2203), all of which are shown in FIG. 22, the boundaries of the PN junctions are different from each other. Characteristics of guided-mode resonance are changed by the lattice constants of the periodic structure of the guided-mode resonators, and the shape and the thickness of a unit structure of the guided-mode resonators. It is known that, in general, as the size of a unit structure present at a lattice point increases, the Q-value of resonance decreases, and the resonance peak broadens. Alternatively, such a peak characteristic can be changed by controlling the periodic structure of a refractive index provided at the two-dimensional surface of the guided-mode resonator. Specifically, for example, symmetry of the unit structure of the periodic structure of the refractive index may be disordered, the periodic structure of the refractive index may have a composite period, the period of the periodic structure of the refractive index may have anisotropy, the periodic structure of the refractive index may have a fractal structure, or a defect may be introduced into the periodic structure of the refractive index. Alternatively, the peak characteristic can be changed by mixing a substance, such as a metal having a complex dielectric constant different from that of a guided-mode resonator, with the guided-mode resonator.

Each of R, G, and B need not be spectrally separated and undergo photoelectric conversion by a single guided-mode resonator layer. Therefore, the photo detector may have a structure in which light components corresponding to R, G, and B are spectrally separated and undergo photoelectric conversion by a plurality of guided-mode resonator layers.

The photo detector of this embodiment can be produced by a typical semiconductor process. Guided-mode resonators made of a semiconductor can be provided on a transparent insulating film as follows. Impurities are implanted in a silicon-on-insulator (SOI) wafer that includes a transparent insulating film as the insulator to form a p-type region and an n-type region. Subsequently, a resist material is applied on the wafer by spin coating to form a resist thin film. The resist is then patterned by, for example, electron-beam lithography, near-field optical lithography, or imprinting. Etching is then performed using the patterned resist as a mask to remove Si located in areas other than the pattern portions. Thus, an optical resonant structure composed of a semiconductor is formed on the transparent insulating film. The boundary of the PN junction can be changed by implanting impurities after the etching or by using a mask during implantation of the impurities.

Eighth Embodiment

Figure 23:
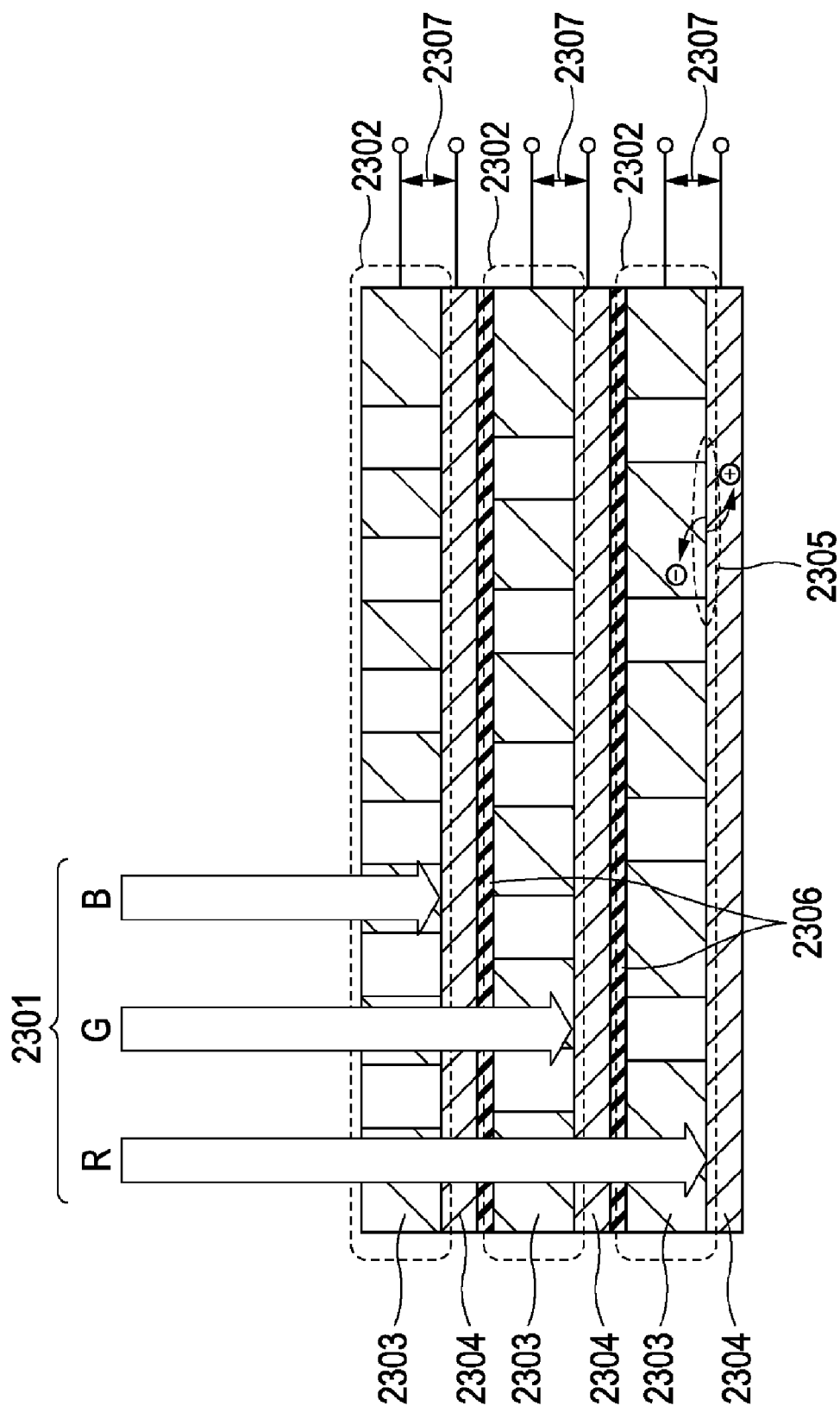
FIG. 23 is a cross-sectional view illustrating an example of a structure of a photo detector of an eighth embodiment.

FIG. 23 shows an example of the structure of a photo detector of an eighth embodiment. In FIG. 23, reference numeral 2301 denotes incident light, reference numeral 2302 denotes a guided-mode resonator, reference numeral 2303 denotes a semiconductor material, reference numeral 2304 denotes a metal, reference numeral 2305 denotes a Schottky junction region, reference numeral 2306 denotes a transparent insulating material, and reference numeral 2307 denotes a readout portion.

In the photo detector of this embodiment, light components each having a specific wavelength corresponding to the structure of a guided-mode resonator are localized by resonance in the in-plane direction, as in the seventh embodiment. Each of the guided-mode resonators 2302 semiconductor can be produced by forming a structure in the semiconductor material 2303. The interface between each of the semiconductor materials 2303 and each of the metals 2304 forms the Schottky junction region 2305, which functions as a photovoltaic material. Consequently, a state in which a light component corresponding to the structure of each of the guided-mode resonators is localized near the structure by guided-mode resonance is realized. Photoelectric conversion of these light components is performed in the layers having different structures respectively corresponding to light components of RGB. The amounts of resulting electric charge are measured as voltage or current signals from the readout portions 2307, and thus, the intensities of the incident light components corresponding to RGB can be determined.

Figure 24:
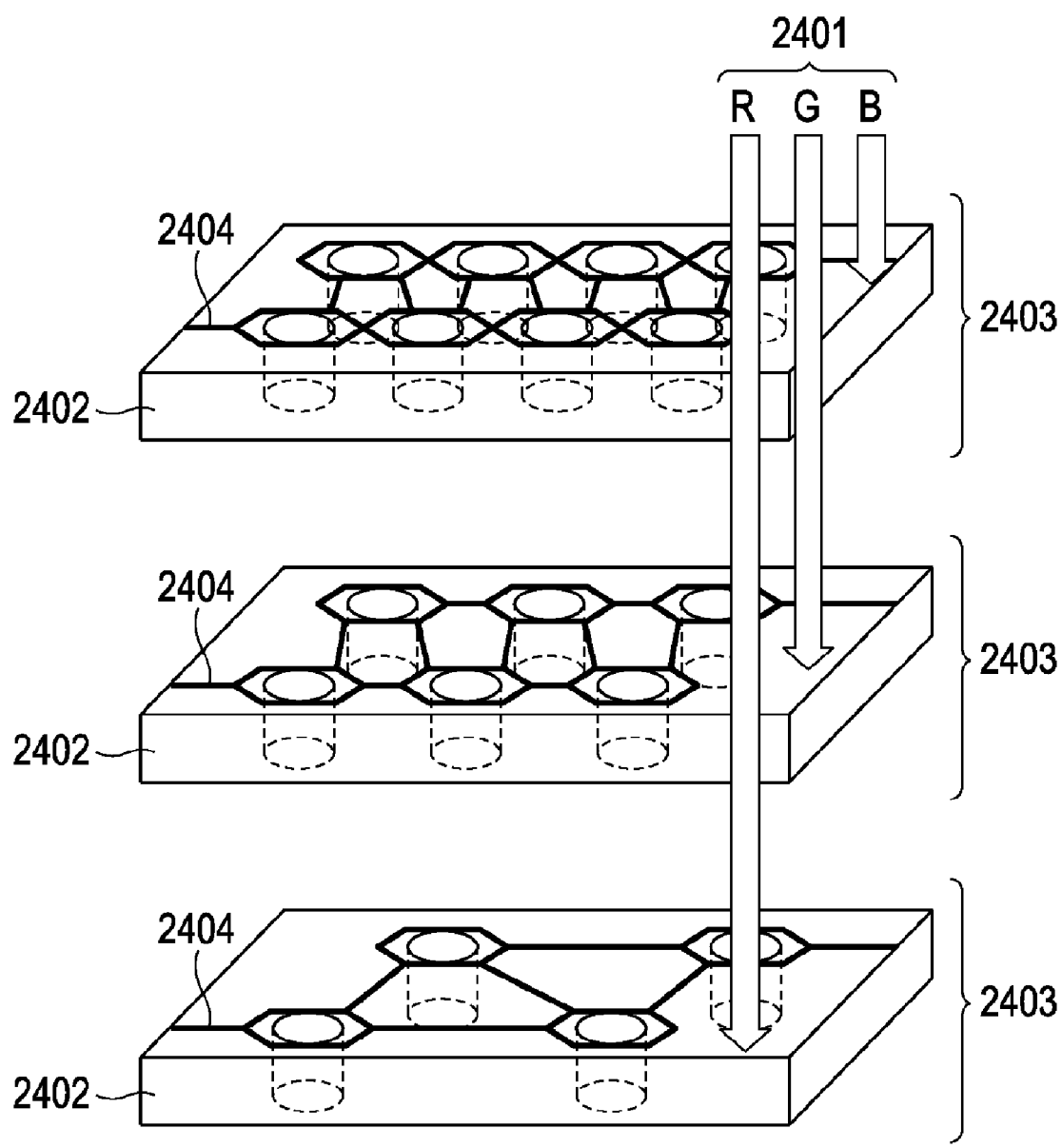
FIG. 24 is a view illustrating a relationship between an arrangement of optical resonant structures and sites where light is absorbed in accordance with the eighth embodiment.

FIG. 24 is a view illustrating the relationship between the arrangement of optical resonant structures and sites where light is absorbed in this embodiment. In FIG. 24, for the sake of convenience, guided-mode resonators 2403 are shown so as to be arranged at certain intervals. In a state in which guided-mode resonance is generated, light is localized in the plane. This light is localized in the in-plane direction of the guided-mode resonators with an electromagnetic field distribution that depends on the structure of the resonators. By designing a structure in which a position where the electromagnetic field intensity is high is matched with a position of a depletion layer of a Schottky junction, high sensitivity can be realized.

The photo detector of this embodiment can be produced by a typical semiconductor process. A metal film is formed on an SOI wafer, and a resist material is applied on the wafer by spin coating to form a resist thin film. The resist is then patterned by, for example, electron-beam lithography, near-field optical lithography, or imprinting. Etching is then performed using the patterned resist as a mask to remove Si and the metal film which are located in areas other than the patterned portions. Thus, an optical resonant structure composed of a semiconductor is formed on a transparent insulating film, and a mesh-shaped metal thin film is formed on the optical resonant structure.

Ninth Embodiment

Figure 25:
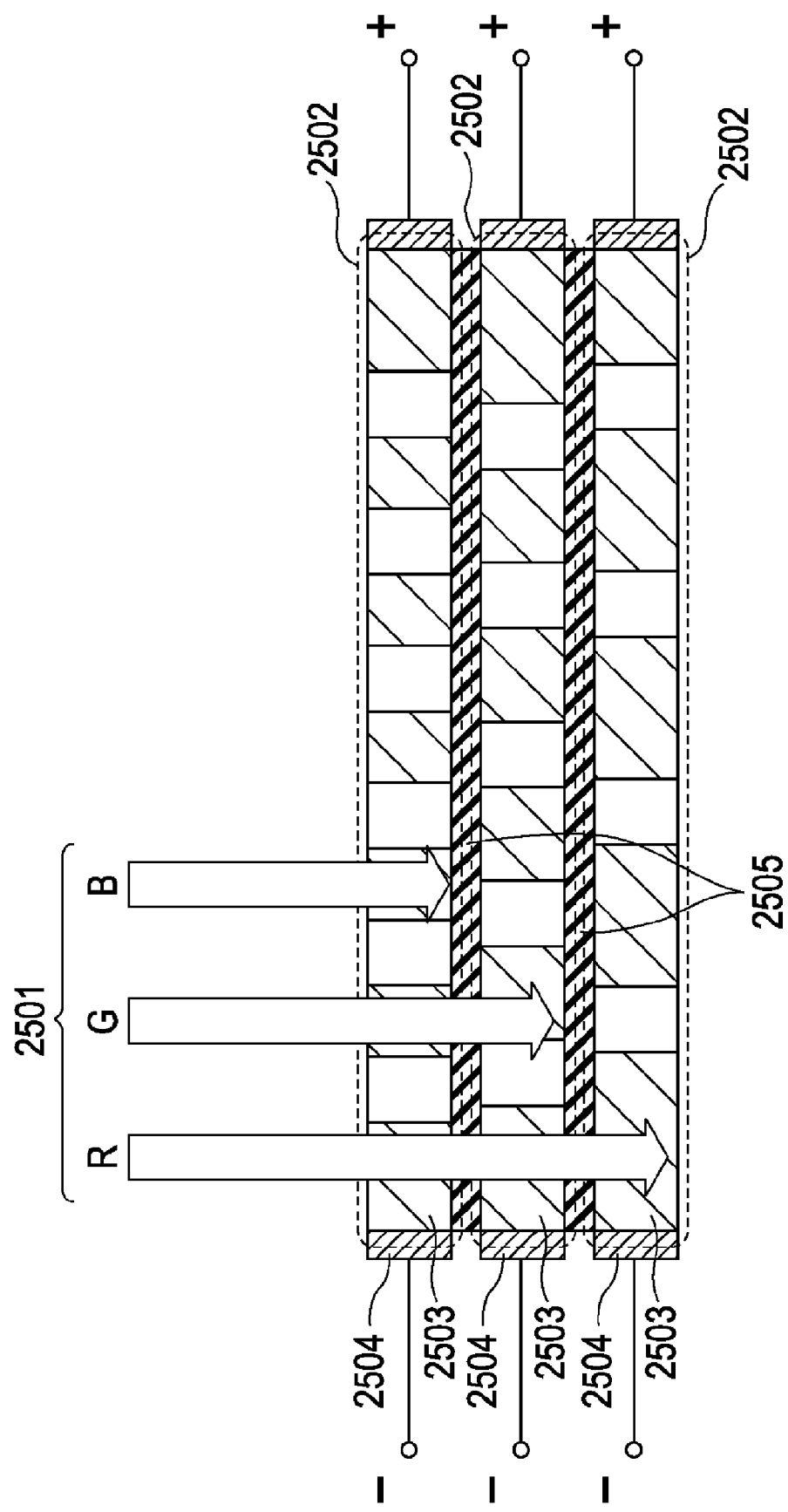
FIG. 25 is a cross-sectional view illustrating an example of a structure of a photo detector of a ninth embodiment.

FIG. 25 shows an example of the structure of a photo detector of a ninth embodiment. In FIG. 25, reference numeral 2501 denotes incident light, reference numeral 2502 denotes a guided-mode resonator, reference numeral 2503 denotes a photoconductive material, reference numeral 2504 denotes an electrode, and reference numeral 2505 denotes a transparent insulating material.

In the photo detector of this embodiment, light components each having a specific wavelength corresponding to the structure of a guided-mode resonator are localized by resonance in the in-plane direction, as in the seventh and eighth embodiments. Each of the guided-mode resonators 2502 can be produced by forming a structure in the photoconductive material 2503. Regarding light components incident on the guided-mode resonators made of the photoconductive material, only a light component corresponding to the structure of a guided-mode resonator is localized in the in-plane direction. Light components that do not resonate with the structure pass through the guided-mode resonator and the transparent insulating material 2505, and are incident on another laminated guided-mode resonator having a different structure. When light is incident on the photoconductive material and causes a photoelectric effect, electrons are excited from the valence band to the conduction band, and the photoconductive material exhibits photoconductivity. By providing an electric potential difference to the electrodes 2504 disposed at both ends of the photoconductive material and measuring the conductivity, the intensity of the incident light can be determined.

In order to determine the light intensity from the conductivity, each of the electrodes provided at both ends of the photoconductive material may be connected to the photoconductive material by an ohmic junction. In order to receive light components of three colors of RGB, three guided-mode resonator layers made of the photoconductive material are laminated. In a state in which guided-mode resonance is generated, light is localized in the plane. This light is localized in the in-plane direction of the guided-mode resonators with an electromagnetic field distribution that depends on the structure of the resonators. By designing a structure in which an area where the electromagnetic field intensity is high is generated in an area of a guided-mode resonator, high sensitivity can be realized.

Tenth Embodiment

Figure 26:
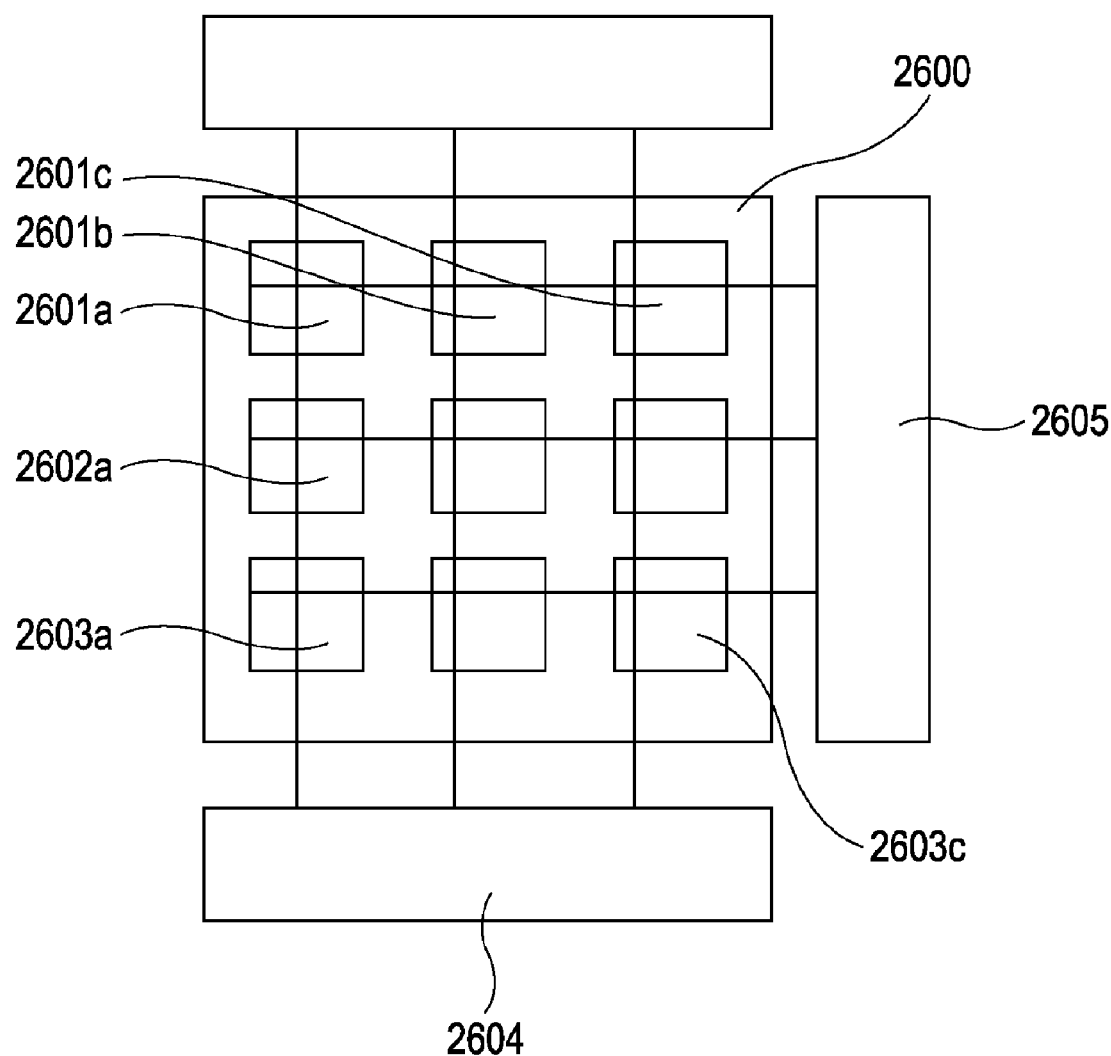
FIG. 26 is a schematic view showing an example of an image sensor according to a tenth embodiment of the present invention in which a plurality of photo detectors according to an embodiment of the present invention are arranged in an array.
Figure 27:
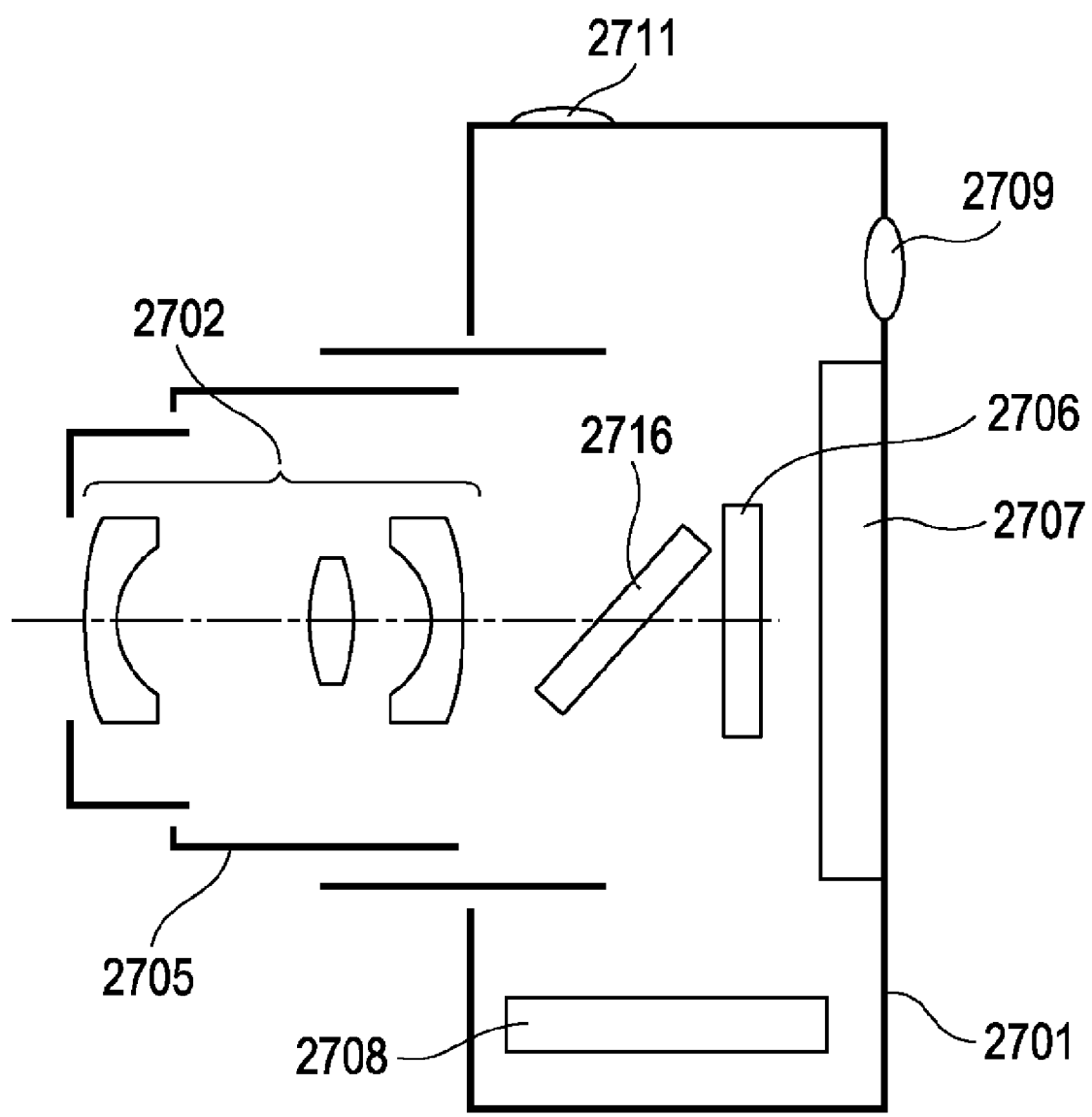
FIG. 27 is a schematic view showing an example of a digital camera including the image sensor according to the tenth embodiment of the present invention.

This embodiment relates to an example of a digital camera including an image sensor produced by arranging the photo detectors described in the fourth embodiment (see FIG. 15) of the present invention in an array. FIG. 26 is a schematic view of the image sensor of this embodiment. In FIG. 26, a plurality of photo detectors (pixels) 2601a to 2603c according to the embodiment of the present invention are arranged in a pixel area 2600 in a two-dimensional matrix, which includes three rows and three columns. Each of the photo detectors (pixels) includes the plasmon resonators 1502, which are optical resonant structures, the photoelectric conversion regions 1503 to 1507, and the readout portion 1508, all of which are shown in FIG. 15. In FIG. 26, the pixel area 2600 has a two-dimensional matrix shape including three rows and three columns. Alternatively, the pixel area 2600 may have a matrix shape including, for example, 7,680 rows and 4,320 columns. In FIG. 26, a vertical scanning circuit 2605 and a horizontal scanning circuit 2604 are circuits used for selecting the photo detectors (pixels) arranged in the pixel area 2600 and reading out the photo detectors (pixels). FIG. 27 is a schematic of a digital camera including the image sensor having the structure shown in FIG. 26. In FIG. 27, reference numeral 2701 denotes a camera body, reference numeral 2709 denotes an eyepiece, reference numeral 2711 denotes a shutter, and reference numeral 2716 denotes a mirror. Reference numeral 2706 denotes an image sensor of the this embodiment. Light is incident on the image sensor 2706 through an imaging optical system (i.e., lenses) 2702 for image forming provided in a lens barrel 2705. Accordingly, an electric charge is generated at each of the pixels of the image sensor 2706 in accordance with an image of an object, and the image of the object can be reproduced in accordance with the electric charges. The image of the object can be reproduced with a display device 2707 for monitor, and is recorded in a recording medium 2708 such as a memory card.

According to the image sensor of this embodiment, a color filter need not be provided. Therefore, the thickness of the image sensor can be reduced, and eclipsing and color mixing can be suppressed. Furthermore, each of the pixels has a color sensitivity for the wavelengths corresponding to all of R, G, and B, and thus false colors are not generated.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-178494 filed Jul. 6, 2007, which is hereby incorporated by reference herein in its entirety.

What is claimed is:

1. A photo detector comprising a plurality of laminated photoelectric conversion layers,
    wherein optical resonant structures having resonance peaks in different wavelength ranges, respectively, are provided in the plurality of photoelectric conversion layers so as to correspond respectively to the plurality of photoelectric conversion layers, and
    wherein the optical resonant structures are guided-mode resonators that function as the plurality of photoelectric conversion layers and also function as elements for spectral separations.

2. The photo detector according to claim 1, wherein a part of each of the guided-mode resonators is made of a semiconductor.

3. A photo detector comprising a plurality of laminated photoelectric conversion layers,
    wherein optical resonant structures having resonance peaks in different wavelength ranges, respectively, are provided in the plurality of photoelectric conversion layers so as to correspond respectively to the plurality of photoelectric conversion layers, and
    wherein the optical resonant structures are guided-mode resonators and each of the guided-mode resonators has a periodic structure of a refractive index.

4. The photo detector according to claim 3, wherein the periodic structure of the refractive index is formed by introducing a defect.

5. The photo detector according to claim 3, wherein the periodic structure of the refractive index is a fractal structure.

* * * * *